US012205910B2

United States Patent
Sato et al.

(10) Patent No.: US 12,205,910 B2
(45) Date of Patent: Jan. 21, 2025

(54) INTEGRATED CIRCUIT BOND PAD WITH MULTI-MATERIAL TOOTHED STRUCTURE

(71) Applicant: Microchip Technology Incorporated, Chandler, AZ (US)

(72) Inventors: Justin Sato, West Linn, OR (US); Bomy Chen, Newark, CA (US); Yaojian Leng, Portland, OR (US); Gerald Marsico, Monument, CO (US); Julius Kovats, Manitou Springs, CO (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/141,621

(22) Filed: May 1, 2023

(65) Prior Publication Data

US 2023/0260938 A1    Aug. 17, 2023

Related U.S. Application Data

(62) Division of application No. 17/163,645, filed on Feb. 1, 2021, now Pat. No. 11,682,641.

(Continued)

(51) Int. Cl.
    *H01L 21/60*     (2006.01)
    *H01L 23/00*     (2006.01)

(52) U.S. Cl.
    CPC ........... *H01L 24/05* (2013.01); *H01L 24/03* (2013.01); *H01L 24/08* (2013.01); *H01L 24/89* (2013.01);

(Continued)

(58) Field of Classification Search
    CPC .................. H01L 2224/0361–80895
    See application file for complete search history.

(56) References Cited

U.S. PATENT DOCUMENTS

| 6,045,026 A | 4/2000 | Hembree et al. ......... 228/110.1 |
| 6,610,601 B2 | 8/2003 | Li et al. ........................ 438/687 |

(Continued)

FOREIGN PATENT DOCUMENTS

| EP | 1978559 A2 | 10/2008 | ............ H01L 21/60 |
| WO | 2007/123778 A1 | 11/2007 | ............ C01B 31/02 |

OTHER PUBLICATIONS

Jansen, Henri et al., "A Survey on the Reactive Ion Etching of Silicon in Microtechnology," Journal of Micromechanics and Microengineering, 15 pages, 1996.

(Continued)

*Primary Examiner* — Hoa B Trinh
(74) *Attorney, Agent, or Firm* — SLAYDEN GRUBERT BEARD PLLC

(57) ABSTRACT

An integrated circuit device may include a multi-material toothed bond pad including (a) an array of vertically-extending teeth formed from a first material, e.g., aluminum, and (b) a fill material, e.g., silver, at least partially filling voids between the array of teeth. The teeth may be formed by depositing and etching aluminum or other suitable material, and the fill material may be deposited over the array of teeth and extending down into the voids between the teeth, and etched to expose top surfaces of the teeth. The array of teeth may collectively define an abrasive structure. The multi-material toothed bond pad may be bonded to another bond pad, e.g., using an ultrasonic or thermosonic bonding process, during which the abrasive teeth may abrade, break, or remove unwanted native oxide layers formed on the respective bond pad surfaces, to thereby create a direct and/or eutectic bonding between the bond pads.

20 Claims, 19 Drawing Sheets

Related U.S. Application Data

(60) Provisional application No. 63/064,958, filed on Aug. 13, 2020.

(52) U.S. Cl.
CPC ............. *H01L 2224/0361* (2013.01); *H01L 2224/05557* (2013.01); *H01L 2224/05578* (2013.01); *H01L 2224/05639* (2013.01); *H01L 2224/05724* (2013.01); *H01L 2224/05839* (2013.01); *H01L 2224/08225* (2013.01); *H01L 2224/80895* (2013.01)

(56) References Cited

U.S. PATENT DOCUMENTS

| | | | |
|---|---|---|---|
| 2005/0048697 A1 | 3/2005 | Uang et al. | 438/108 |
| 2007/0193682 A1 | 8/2007 | Sasaoka et al. | 156/281 |
| 2008/0224327 A1* | 9/2008 | Suh | H01L 24/13 257/782 |
| 2009/0072385 A1 | 3/2009 | Alley et al. | 257/713 |
| 2010/0283148 A1 | 11/2010 | Tsai et al. | 257/737 |
| 2011/0254154 A1 | 10/2011 | Topacio et al. | 257/737 |
| 2012/0119359 A1* | 5/2012 | Im | H01L 25/0657 257/737 |
| 2013/0241083 A1 | 9/2013 | Yu et al. | 257/780 |
| 2020/0251248 A1* | 8/2020 | Yamazaki | C01B 32/168 |

OTHER PUBLICATIONS

Ji, Hongjun et al., "Microstructure and Reliability of Hybrid Interconnects by Au Stud Bump with Sn—0.7Cu Solder for Flip Chip Power Device Packaging," Microelectronics Reliability, vol. 66, pp. 134-142, Oct. 10, 2016.

Fu, Shao-Wei et al., "Direct Silver to Aluminum Solid-State Bonding Processes," Materials Science and Engineering, vol. 176, pp. 160-166, Mar. 4, 2018.

Zhang, Liang et al., "Materials, Processing and Reliability of Low Temperature Bonding in 3D Chip Stacking," Journal of Alloys and Compounds, 750, pp. 980-995, Apr. 7, 2018.

Media ATN "Flip Chip Bump Technology: Au Stud," Alter Technology Group, URL: https://wpo-altertechnology.com/flip-chip-bump-technology-au-stud/, 5 pages, Retrieved Feb. 24, 2021.

Carey, James E. et al., "IR Detectors: Black silicon sees further into the IR," URL: https://www.laserfocusworld.com/detectors-imaging/article/16565915/ir-detectors-black-silicon-sees-further-into-the-ir, 11 pages, Retrieved Feb. 24, 2021.

Partial International Search Report and Invitation to Pay Additional Fees, Application No. PCT/US2021/018154, 13 pages, Jul. 8, 2021.

International Search Report and Written Opinion, Application No. PCT/US2021/018154, 25 pages, Aug. 30, 2021.

* cited by examiner

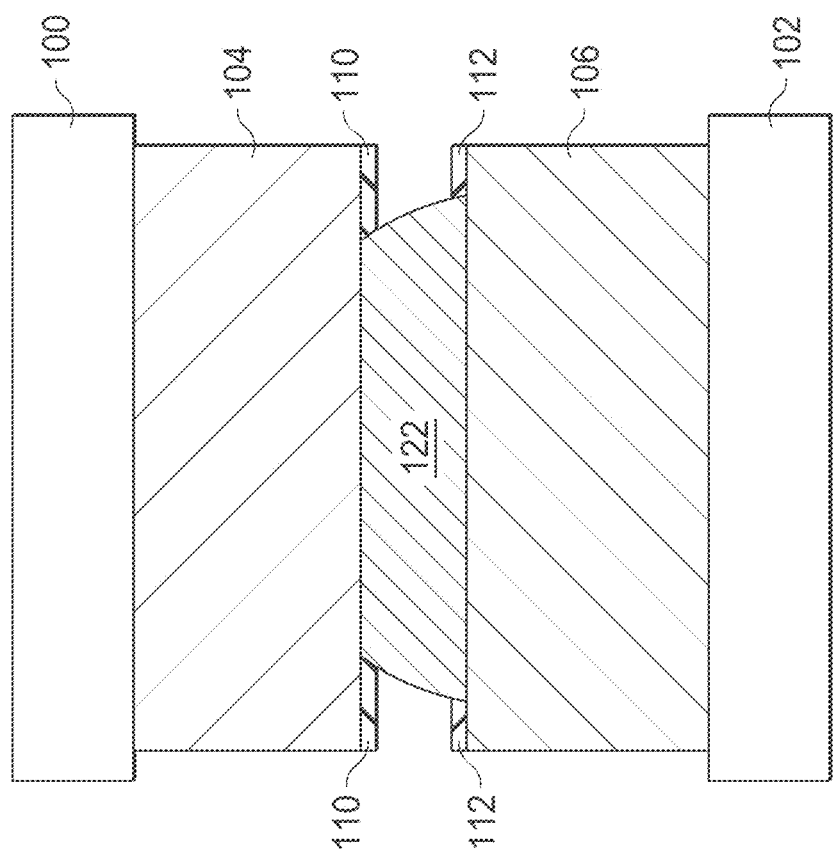
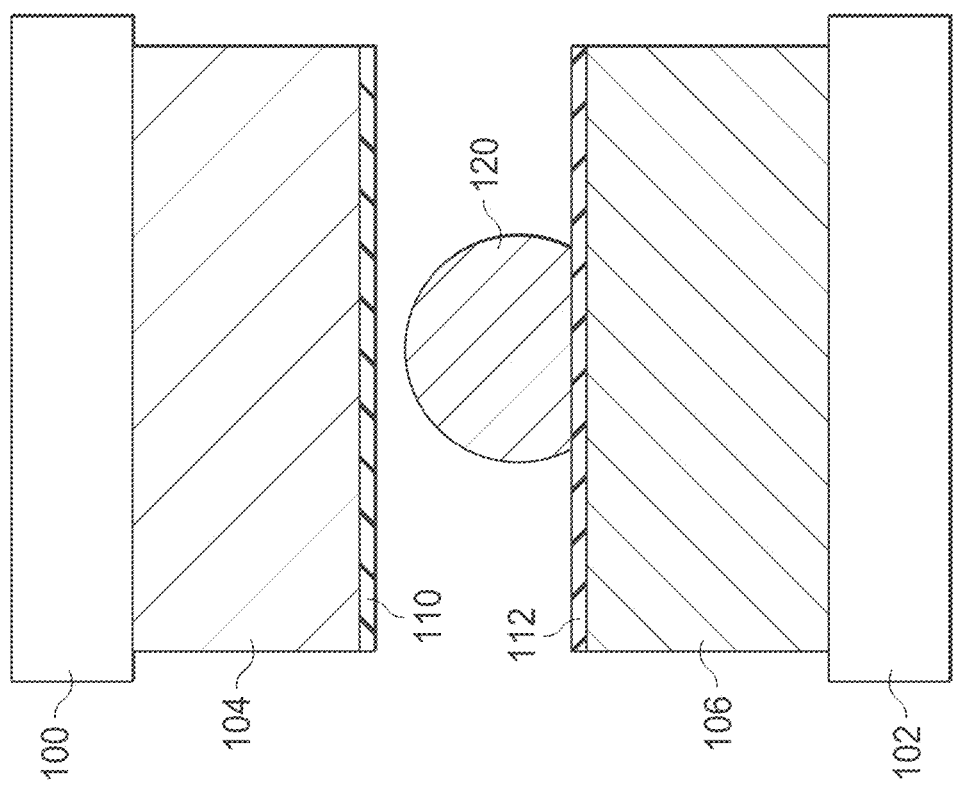
FIG. 1B (PRIOR ART)
FIG. 1A (PRIOR ART)

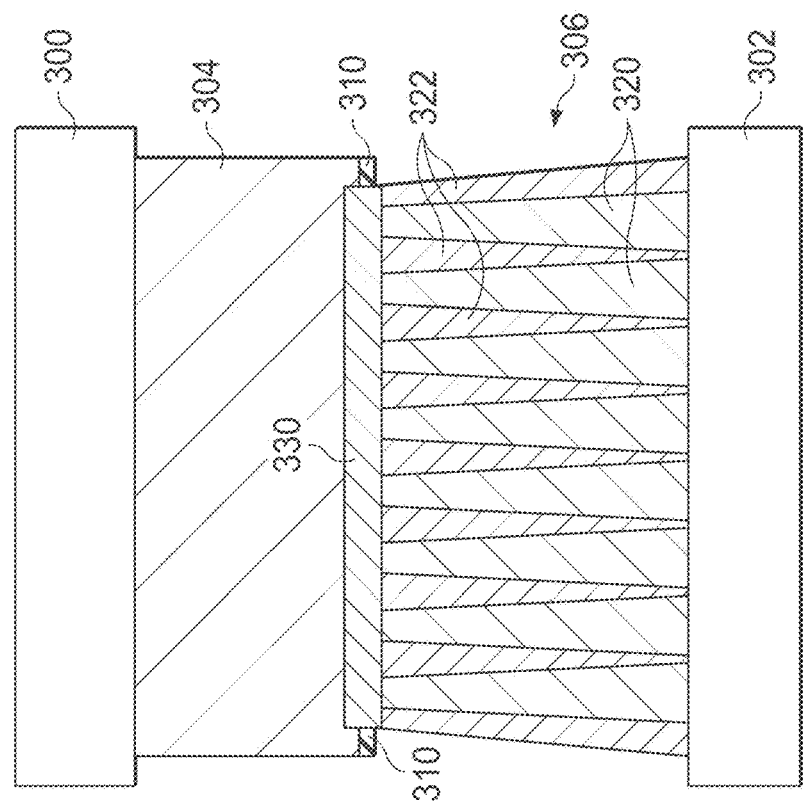
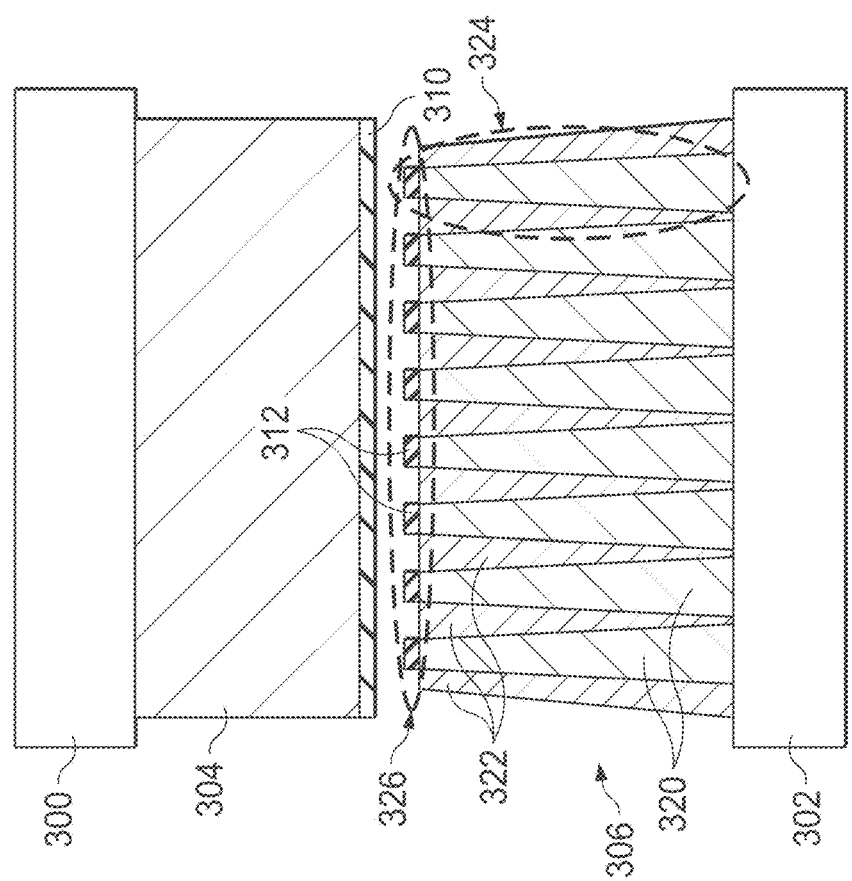
FIG. 3B
FIG. 3A

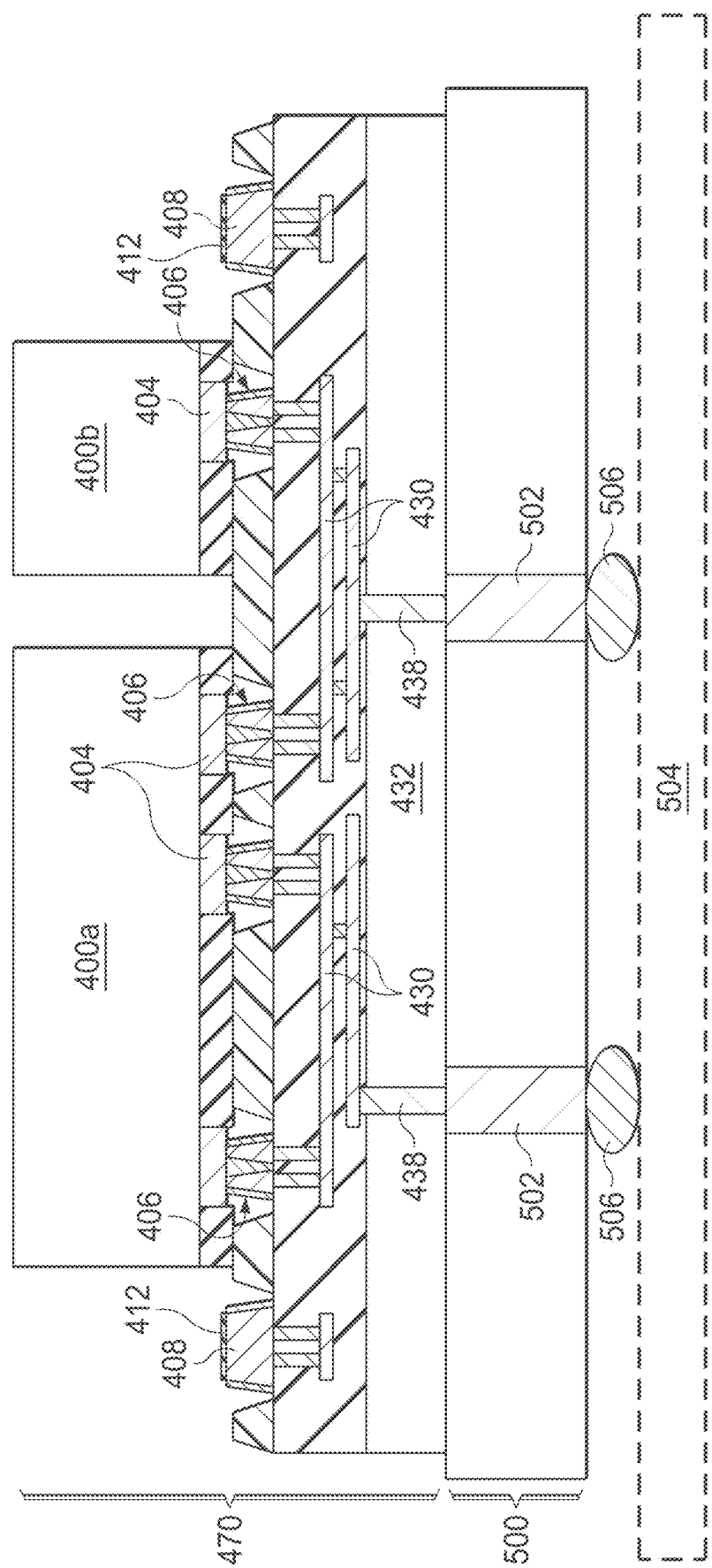

INTEGRATED CIRCUIT BOND PAD WITH MULTI-MATERIAL TOOTHED STRUCTURE

RELATED APPLICATIONS

This application is a divisional of U.S. application Ser. No. 17/163,645 filed on Feb. 1, 2021, which claims priority to commonly owned U.S. Provisional Patent Application No. 63/064,958 filed Aug. 13, 2020, the entire contents of which applications are hereby incorporated by reference for all purposes.

TECHNICAL FIELD

The present disclosure relates to integrated circuit (IC) bond pads, and more particularly to multi-material (e.g., multi-metal) bond pads having a "toothed" structure, for improved bonding connections.

BACKGROUND

Semiconductor bond pads, for bonding a die (chip) to a mounting structure, e.g., an interposer, another die, a package substrate, or other structure, are typically made of aluminum or copper, which easily oxidize when exposed to air, forming a thin, brittle layer of native oxide, e.g., comprising $Al_2O_3$ or CuO, on exposed surfaces of each bond pad. This native oxide inherently inhibits direct or eutectic bonding to the bond pads for bonding the die to the mounting structure. Thus, bonding techniques should overcome this native oxide barrier to form high quality, reliable bonds.

Conventional bonding approaches include (a) wire bonding, e.g., using a large downforce and ultrasonic bonding or thermosonic bonding, (b) direct bonding by thermocompression, e.g., applying a large downforce with applied heat (e.g., in the range of 250° C. to 280° C.) to crack the native oxides, (c) eutectic bonding, (d) applying oxide inhibitors, e.g., benzotriazoles (BTA) or other organic solderability preservatives (OSP's), to exposed surfaces to slow oxide growth after cleaning, (e) soldering using flux (which burns off the native oxide), (e) or laser welding (which burns off the native oxide), for example. Thermosonic bonding refers to ultrasonic bonding with applied heat, e.g., in the range of 200° C. to 250° C.

Each of these conventional bonding techniques has significant drawbacks or limitations.

For example, wire bonding has various problems and is not suitable for certain die mounting applications. For example, wire bonding typically cannot be used for die stacking or other three-dimensional die integration. Further, wire bonding is limited by a maximum number of bonds per mm. Wire bonding can also cause significant damage to underlying semiconductor devices. Moreover, wire bond connections can introduce noise (e.g., induction and capacitive noise) caused by multiple wires in close proximity to one another.

As another example, typical soldering techniques, e.g., using a ball grid array (BGA), are difficult to scale and provide weak thermal resistance. FIGS. 1A and 1B show cross-sectional side views of a conventional solder bump bonding process for bonding a die 100 to a mounting structure 102, e.g., an interposer or package substrate. FIG. 1A shows the arrangement prior to bonding, and FIG. 1B shows the arrangement after a solder bond.

As shown in FIG. 1A, a bond pad 104 on a bottom side of the die 100 is aligned over a bond pad 106 on a top side of the mounting structure 102. Each bond pad 104, 106 is typically formed from copper or aluminum. A thin layer of native oxide, e.g., $Al_2O_3$ or CuO, may form on a bottom surface of bond pad 104 and a top surface of bond pad 106, as indicated at 110 and 112, respectively. A solder bump 120, typically tin, may be formed on bond pad 106 as shown.

Next, as shown in FIG. 1B, the die 100 is pressed down toward the mounting structure 102, such that the solder bump 120 is physically compressed between bond pads 104 and 106. The compression of the solder bump 120 may break and push aside the native oxide layers 110, 112 to provide direct contact between the solder material (e.g., tin) of solder bump 120 and the metal of each bond pad 104, 106 (e.g., aluminum or copper), to thereby define a solder joint 122.

However, as noted above, solder ball bonding (e.g., BGA bonding) is difficult to scale for mounting small devices and typically provides poor thermal resistance.

Another conventional bonding technique mentioned above is eutectic bonding, for example eutectic Al—Ag—Al bonding. FIGS. 2A and 2B show cross-sectional side views of a conventional lead-free direct Ag—Al bonding process for bonding a die 200 to a mounting structure 202, e.g., an interposer or package substrate. FIG. 2A shows the arrangement prior to bonding, and FIG. 2B shows the arrangement after eutectic bonding.

As shown in FIG. 2A, an Al bond pad 204 on a bottom side of the die 200 is aligned over an Al bond pad 206 on a top side of the mounting structure 202. A thin layer of native oxide, i.e. aluminum oxide, $Al_2O_3$, may form on a bottom surface of Al bond pad 204 and a top surface of Al bond pad 206, as indicated at 210 and 212, respectively. A silver (Ag) disc 220 is positioned on the lower Al bond pad 206 as shown.

Next, as shown in FIG. 2B, the die 200 is pressed down toward mounting structure 202 while heat is applied, such that the Ag disc 220 is physically compressed between Al bond pads 204 and 206. This heated compression of the Ag disc 220 causes a eutectic reaction that forms an intermetallic compound (IMC) 222 between the Al bond pads 204 and 206. In particular, the IMC 222 comprises a eutectic alloy containing components of the Ag disc 220 and the Al bond pads 204, 206, which defines a eutectic bond between Al bond pads 204 and 206, as known in the art.

However, such eutectic bonding typically requires very high bonding temperatures (e.g., above 400° C.), which may destroy many silicon devices. In addition, eutectic bonding of aluminum pads is typically very difficult due to the native oxide layer that protects the Al bond pad surfaces.

Another conventional bonding technique mentioned above is laser welding. Laser welding may effectively remove the thin native oxide layer from the respective bond pads, but it is typically slow and very expensive, as a laser must heat up each individual bond in the interstitial space between the structures being bonded together.

Thus, there is a need for improved bonding solutions, e.g., for heterogeneous integration technologies such as system-in-a-package (SiP) applications.

SUMMARY OF THE INVENTION

Embodiments of the invention provide integrated circuit devices including multi-material toothed bond pads including (a) an array of vertically-extending teeth formed from a first material, e.g., aluminum, and (b) a fill material, e.g., silver, different from the first material, at least partially filling voids between the array of teeth. The teeth may be formed by depositing and etching aluminum or other suitable material, and the fill material may be deposited over the array of teeth and extending down into the voids between the teeth, and etched to expose top surfaces of the teeth. A very hard native oxide layer, e.g., aluminum oxide, may formed on exposed surfaces of the teeth. The array of teeth may collectively define an abrasive bond pad structure. The multi-material toothed bond pads may be bonded to other bond pads, e.g., using an ultrasonic or thermosonic bonding process, during which the abrasive bond pad teeth may abrade, break, and/or remove native oxide layers formed on the teeth and on the opposing bond pad, to allow a direct and/or eutectic bonding between the bond pads.

Some embodiments provide multi-material toothed bond pads suitable to withstand high temperatures (e.g., suitable for SiC/GaN technologies) and tin-based bonds and can form a direct bond with aluminum bond pads, e.g., using an ultrasonic or thermosonic bonding tool. Direct bonding to aluminum is generally very difficult due to resilient native oxide layers that protect the aluminum surfaces. The multi-material toothed bond pads may define an abrasive structure that abrades, breaks, or removes the protective native oxide layers.

In some embodiments, a multi-material toothed bond pad may provide simultaneously contact between multiple types of materials during mounting of a die. The multi-material toothed bond pad may form a eutectic bond with an opposing bond pad or structure, and thus bond at much lower temperature requirements than a conventional bond pad, especially with the application of a downforce and/or ultrasonic or thermosonic energy input. In some embodiments, the teeth can be roughened or otherwise modified in various ways to increase abrasion and friction created by the toothed bond pad, and/or to increase the relevant surface area available for bonding.

In one aspect, an integrated circuit (IC) device includes metal circuitry and at least one multi-material toothed bond pad connected to the metal circuitry. Each multi-material toothed bond pad includes (a) a plurality of teeth formed from a first material, and (b) a fill material located between the plurality of teeth formed from a second material different than the first material. The plurality of teeth may define an abrasive structure configured to facilitate a bonding of another structure to the bond pad, e.g., by abrading, breaking, or removing unwanted native oxide layer(s) between the bond pad and the other structure.

In some embodiments, the IC device comprises an interposer or an IC die.

In some embodiments, the plurality of vertically-extending teeth comprise an oxide layer formed on each vertically-extending tooth. In some embodiments, the second material is softer than the oxide layer formed on each vertically-extending tooth.

In some embodiments, the first material comprises aluminum, and the second material comprises silver, tin, indium, or a mixture of two or more of silver, tin, indium (e.g., 75% Ag and 25% Sn). In other embodiments, the first material comprises silicon.

In some embodiments, each vertically-extending tooth has a height-to-width ratio of at least 2, or at least 3, or at least 4, or at least 5, or at least 10, or in the range of 2 to 10, for example in the range of 3 to 5.

In some embodiments, each tooth includes silicon nodules at an exposed surface of the tooth that increases a roughness of the exposed surface.

Another aspect provides a method of forming a multi-material toothed bond pad including (a) forming a first layer of a first material, (b) etching the first layer to define a plurality of teeth formed from the first material and open spaces between the plurality of teeth, and (c) at least partially filling the open spaces between the plurality of teeth with a second material different than the first material.

In some embodiments, the step of at least partially filling the open spaces between the plurality of teeth with a second material includes (a) depositing a second layer of the second material over the plurality of teeth and extending down into the open spaces between the plurality of teeth, and (b) etching portions of the second material over the plurality of teeth to expose upper surfaces of the plurality of teeth.

In some embodiments, the first material is harder than the second material.

In some embodiments, the first material comprises aluminum, and the second material comprises silver, tin, indium, or a mixture of two or more of silver, tin, indium (e.g., 75% Ag and 25% Sn).

In some embodiments, a roughening process to increase a surface roughness of the plurality of teeth is performed before filling the open spaces with the second material. For example, the roughening process may include a wet etch to increase a porosity of the plurality of teeth, or oxidizing exposed surfaces of the plurality of teeth.

Another aspect provides an IC device bonding method. A first IC device is provided, including a first IC device bond pad comprising (i) a plurality of oxidized teeth, each oxidized tooth comprising a vertically-extending tooth formed from a first material and a first oxide layer formed on the vertically-extending tooth and (ii) a second material arranged in spaces between the plurality of oxidized teeth, the second material being different than the first material, wherein the plurality of oxidized teeth define an abrasive structure. A bonding process is performed to bond the first IC device of the first IC device to a second IC device bond pad of a second IC device, the second IC device bond pad having a second oxide layer formed thereon. During the bonding process, the abrasive structure defined by the plurality of oxidized teeth of the bond pad of the first IC device interacts with the second oxide layer formed on the second IC device bond pad to abrade, break, or remove the first oxide layer formed on the vertically-extending teeth and the second oxide layer formed on the second IC device bond pad.

In some embodiments, the bonding process includes applying ultrasonic energy or thermosonic energy to at least one of the first IC device bond pad and the second IC device bond pad.

In some embodiments, the bonding process causes a eutectic bonding between the first IC device bond pad and second IC device bond pad.

In some embodiments, the bonding process causes a eutectic bonding between (a) the first material forming the vertically-extending teeth of the first IC device bond pad, (b) the second material arranged in spaces between the plurality of vertically-extending teeth, and (c) the second IC device bond pad. In some embodiments, the first material comprises aluminum, the second material comprises silver, and the second IC device bond pad comprises aluminum.

BRIEF DESCRIPTION OF THE DRAWINGS

Example aspects of the present disclosure are described below in conjunction with the figures, in which:

FIGS. 1A and 1B show cross-sectional side views of a conventional solder bump bonding process for bonding a die to a mounting structure;

FIGS. 3A and 3B show cross-sectional side views showing the bonding of a die to a mounting structure using at least one multi-material toothed bond pad, according to an example embodiment of the present invention;

FIG. 5 is a cross-sectional side view showing a populated TSV interposer mounted on a package substrate, according to one example embodiment;

Figure 2B:
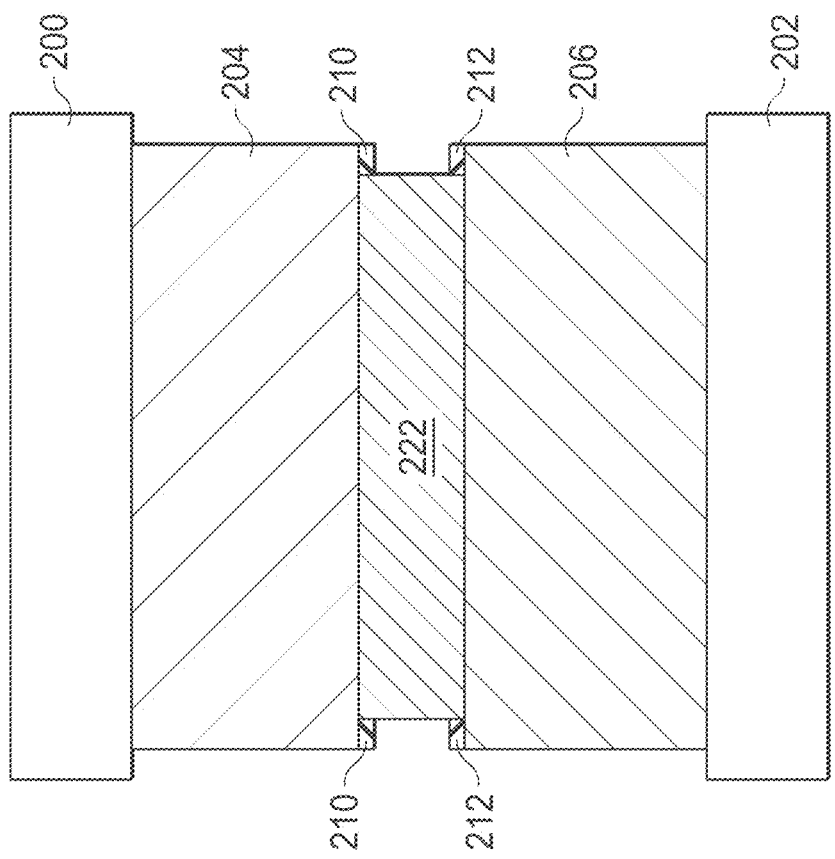
FIGS. 2A and 2B show cross-sectional side views of a conventional direct (eutectic) bonding process for bonding a die to a mounting structure.
Figure 2A:
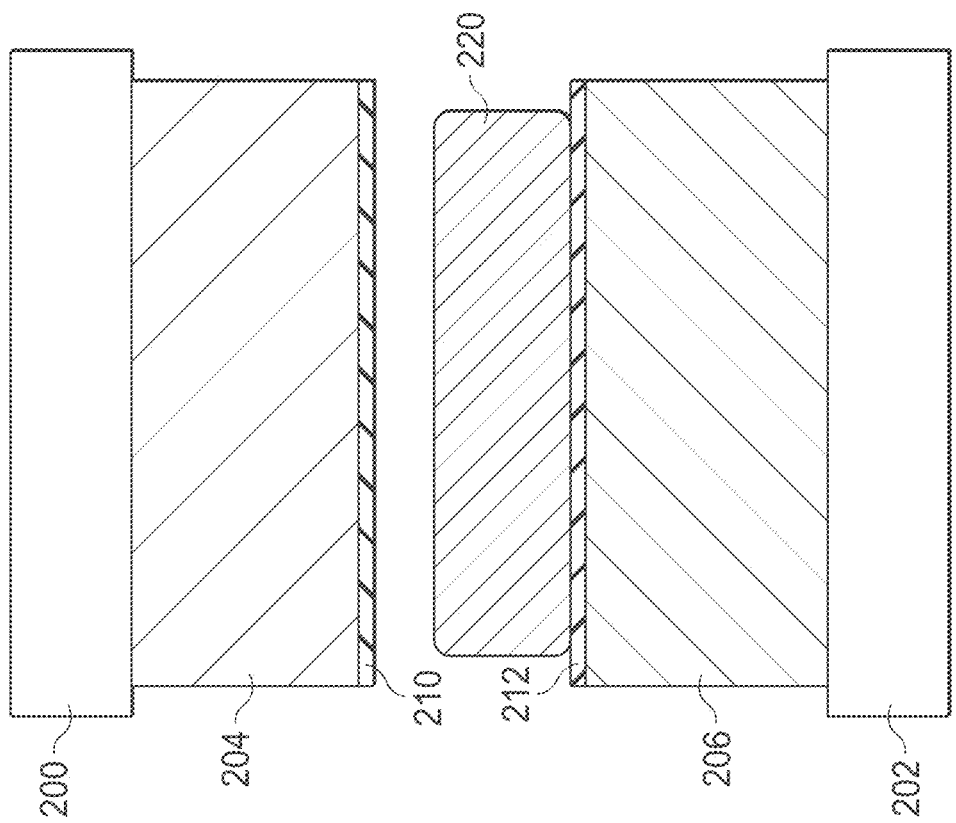

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the invention provide multi-material toothed bond pads, methods for forming such bond pads, and method for improved bonding of IC devices using such bond pads.

FIGS. 3A and 3B show cross-sectional side views showing the bonding of a die 300 to a mounting structure 302 using at least one multi-material toothed bond pad, according to an example embodiment of the present invention. FIG. 3A shows the arrangement prior to bonding, and FIG. 3B shows the arrangement after a solder bond. As used herein, a "mounting structure" may comprise an interposer, a package substrate, or any other integrated circuit device to which one or more die may be mounted.

As shown in FIG. 3A, a bond pad 304 on a bottom side of the die 300 is aligned over a bond pad 306 on a top side of the mounting structure 302. Bond pad 304 formed on die 300 may be formed from copper (Cu), aluminum (Al), nickel (Ni), gold (Au), or any other suitable bond pad material. Multi-material bond pad 306 may include (a) an array of vertically-extending projections, referred to herein as teeth, 320 formed from a first metal, and (b) a fill material 322 comprising a second metal arranged between the various teeth 320, such that the two different metals of the teeth 320 and fill material 322 are arranged in an interlaced or interleaved manner. Bond pad 306 may include any number of teeth 320, for example in the range of 2 to 10,000 teeth 320. The term vertically-extending is used herein in the context of a mounting structure oriented horizontally, e.g., as shown in the various figures. If the relevant mounting structure of any disclosed embodiment is instead oriented vertically, the teeth will extend horizontally.

As used herein, a "tooth" may include any vertically-elongated structure, e.g., in the form of a tooth, spike, spire, blade, tube, or rod; may be symmetrical or asymmetrical around each axis; may or may not be tapered; and may have a sharp, smooth, dull, or rough upper tip or upper end, i.e., a tip or end of the tooth distal from the relevant mounting structure 302. Teeth 320 may be formed from a material that grows a hard native oxide layer, for example aluminum which grows native aluminum oxide ($Al_2O_3$), tungsten which grows native tungsten oxide ($WO_3$), or silicon which grows silicon dioxide ($SiO_2$). In some embodiments, the teeth themselves be formed from a hard material, e.g., in the case of tungsten or silicon teeth.

Fill material 322 may be added between the various teeth 320 of each toothed bond pad 306 in any suitable manner, e.g., by depositing a layer of fill material extending down into the spaces between teeth 320 and removing portions of the fill material covering the tops of teeth 320 and between adjacent toothed bond pads 306. In some embodiments, the fill material 322 may be added prior to the growth of the native oxide layer (e.g., $Al_2O_3$ layer) to thereby provide direct contact between the fill material 322 and teeth 320. In such embodiments, the native oxide layer may grow only on surfaces of teeth 320 that remain exposed after adding fill material 322, e.g., surfaces at or near the upper ends or tips of teeth 320. For example, in the embodiment shown in FIG. 3A, a native oxide layer 312 comprising aluminum oxide ($Al_2O_3$) may form on exposed upper surfaces of each aluminum tooth 320, while exposed upper surfaces of the silver fill material may remain substantially free of oxide. In other embodiments, one or more native oxide layer may form on both exposed upper surface areas of each tooth 320 and exposed upper surface areas of fill material 322, depending on the composition of teeth 320 and fill material 322.

Similar to oxide layer 312, a thin native oxide layer 310 may also form on the mounting side of bond pad 304 (i.e., the side of bond pad 304 to be mounted to bond pad 306), e.g., a native $Al_2O_3$ or CuO layer, depending on the composition of bond pad 304.

Each tooth 320 having a native oxide layer 312 formed on the upper end or tip of the tooth 320 may be referred to herein as an oxidized tooth, indicated at 324. The upper ends or tips of the oxidized teeth 324 included in each bond pad 306, including the native oxide layer 312 on each the upper end or tip of respective tooth 320, may collectively define a hard, abrasive structure indicated at 326. The abrasive structure 326 may be suitable for abrading or grinding against the native oxide layer 310 formed on bond pad 304, to abrade, break, and/or remove the native oxide layers 310 and 312 on bond pads 304 and 306, respectively, which may allow direct and/or eutectic bonding between the materials of bond pads 304 and 306, as discussed below with reference to FIG. 3B.

In some embodiments, teeth 320 may be roughened prior to formation of the native oxide 312. For example, where a chlorine-based plasma etch (dry etch) is used to form the teeth 320 from an aluminum layer, various process parameters of the chlorine-based plasma etch may be selected or controlled to increase a porosity of the outer surfaces of teeth 320 (e.g., by creating small fissures or voids in the aluminum). As another example, an HCL wet etch may be performed to increase porosity of the aluminum surfaces.

The fill material 322 may comprise a metal, metal alloy, or other material that (a) may form a eutectic bond with an opposing bond pad or other bonding structure (e.g., comprising aluminum or copper) at a low eutectic temperature (e.g., below 500° C., below 400° C., or below 300° C.) and/or (b) is softer than the native oxide 312 formed on teeth 320 (e.g., $Al_2O_3$, $WO_3$, or $SiO_2$ in the case of aluminum, tungsten, or silicon teeth 320) and/or the material forming teeth 320 themselves (e.g., in the case of tungsten or silicon teeth 320). For example, in some embodiments fill material 322 may comprise silver, tin, or indium, or a mixture of two or more of silver, tin, indium (e.g., a mixture of 75% Ag and 25% Sn), suitable to form a eutectic bond with an aluminum or copper bond pad 306, for example, to form a strong, conductive bond between bond pads 304 and 306. Fill material 322 may partially or completely fill the spaces between adjacent teeth 320, depending on the particular embodiment.

Next, referring to FIG. 3B, the die 300 may be bonded to mounting structure 302 by direct and/or eutectic bonding. In some embodiments, the die 300 may be pressed down toward mounting structure 302 while ultrasonic vibrations (including lateral vibrations) and/or heat are applied to at least one of the die 300/bond pad 304 and mounting structure 302/bond pad 306. For example, an ultrasonic or thermosonic head may apply downward force, ultrasonic energy (causing vibrations) and/or heat to the die 300, which heat is transferred to bond pad 304. In addition, the mounting structure 302 may be heated by heating a chuck that supports the mounting structure 302, which heat is transferred to multi-material bond pad 306. Alternately, the bonding process may be performed in an oven.

During the ultrasonic or thermosonic bonding process, the abrasive structure 326 defined by the oxidized teeth 324 of bond pad 306 may abrade against the oxide layer 310 of bond pad 304 to abrade, break, and/or remove the native oxide layers 310 and 312, allowing direct and/or eutectic bonding between bond pads 304 and 306. For example, in embodiments including aluminum teeth 320, the hard aluminum oxide layer 312 on each tooth 320 abrades the oxide layer 312 on bond pad 304, and vice versa. In embodiments including harder teeth 320, e.g., formed from tungsten or silicon, the teeth 320 may cooperate with the relevant oxide layer 312 on teeth 320 to abrade the oxide layer 312 on bond pad 304.

Depending on the particular process parameters (for example, the selected materials of bond pads 304 and 306, the temperature of bond pads 304 and 306 during bonding, the downward force applied to bond pad 304, and the vibrational forces/movements caused by the ultrasonic energy), the resulting bonding may involve one or both of (a) direct bonding between bond pads 304 and 306 (e.g., between bond pad 304, teeth 320, and fill material 322), and/or (b) eutectic bonding between bond pads 304 and 306, wherein the fill material 322 (e.g., silver) may help form a eutectic IMC layer 330 between (a) bond pad 304 (e.g., aluminum) and (b) the fill material 322 (e.g., silver) and/or teeth 320 (e.g., aluminum) of 306.

In some embodiments, the oxidized teeth 324 may be roughened prior to the bonding process, to further enhance the abrasive structure 326 for facilitating the bonding process. For example, the oxidized teeth 324 may be further oxidized, e.g., in an ash chamber, to increase the thickness and roughness of the oxide layer 312 on teeth 320. As another example, a hydrogen chloride (HCL) wet etch may be performed on the oxidized teeth 324 to increase the porosity of the native oxide 312 and/or underlying tooth metal (e.g., aluminum), which may increase the surface roughness of the oxidized teeth 324.

Figure 4A:
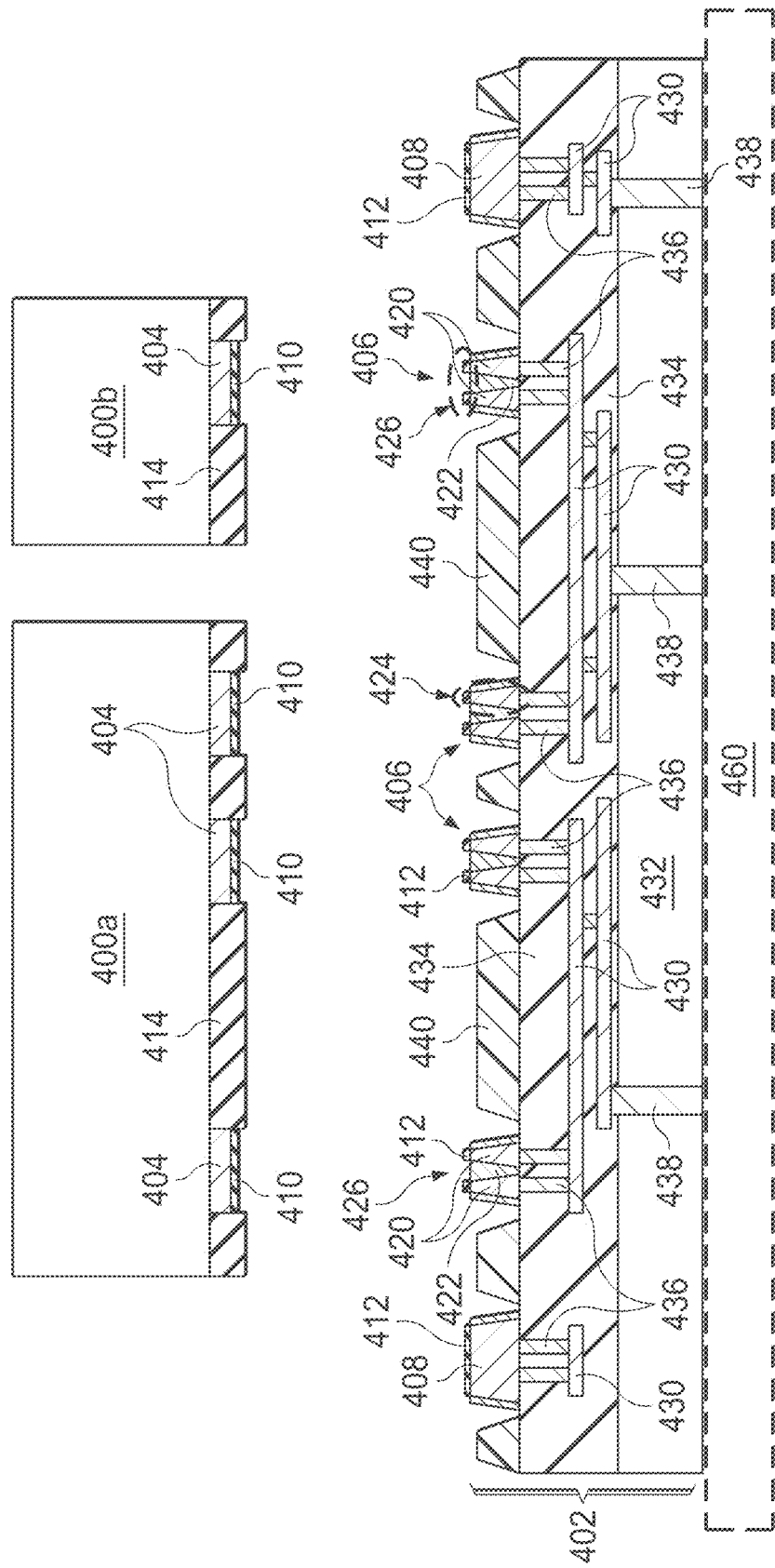
FIGS. 4A and 4B show cross-sectional side views showing a process of bonding two example dies to a mounting structure using multi-material toothed bond pads, according to one example embodiment.
Figure 4B:
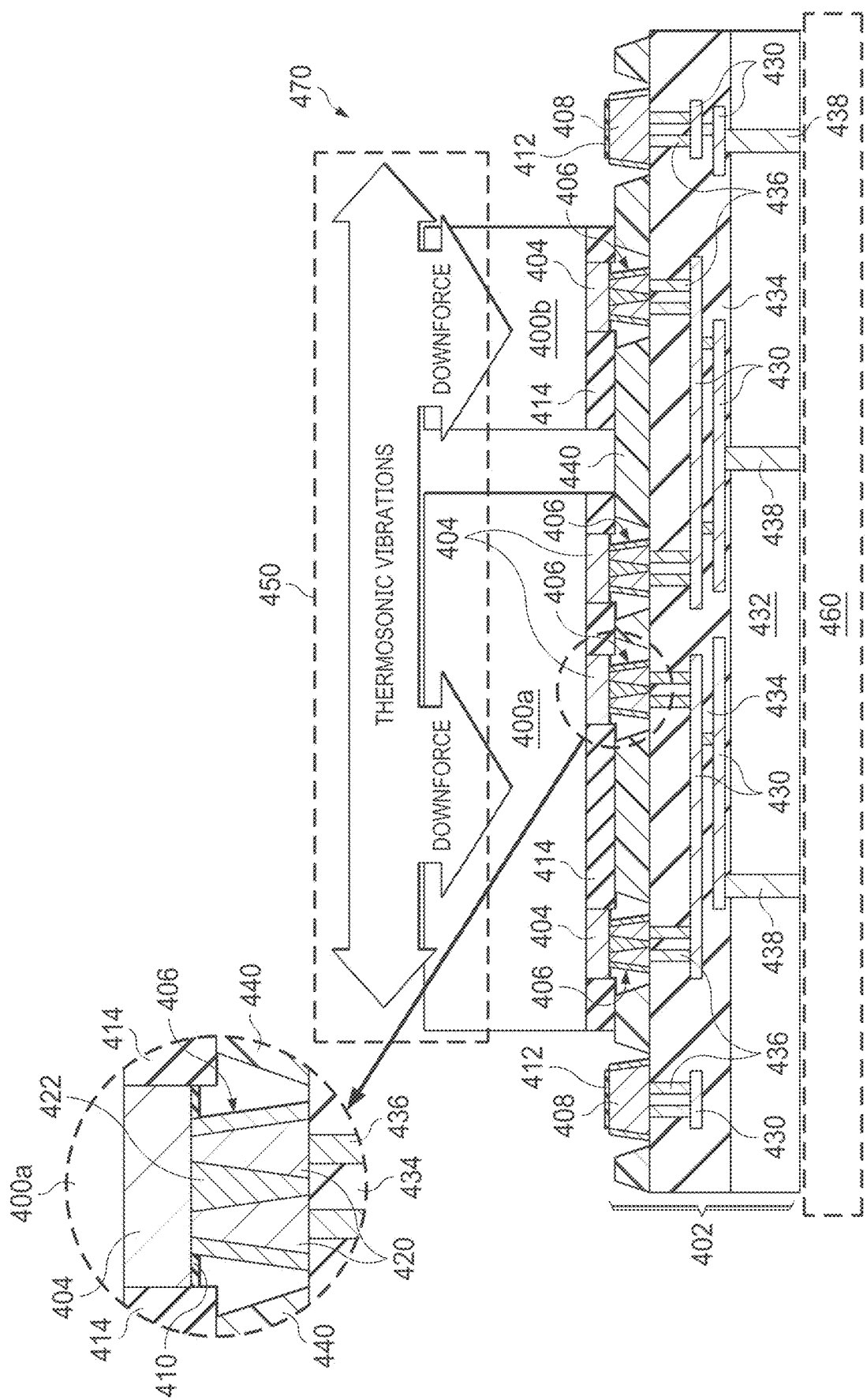

FIGS. 4A and 4B show cross-sectional side views showing a process of bonding two example dies 400a and 400b to a mounting structure 402 using multi-material toothed bond pads 406, according to one example embodiment. In this example, mounting structure 402 is an interposer. FIG. 4A shows the arrangement prior to bonding dies 400a and 400b to interposer 402, and FIG. 4B shows the arrangement after bonding dies 400a and 400b.

Each die 400a and 400b may comprise any type of semiconductor die, e.g., a field programmable gate array (FPGA) or other processor die, a microcontroller, a serial/deserializer (SerDes) die, a memory idea, or any other type of die. As shown, each die 400a, 400b includes at least one bond pad 404 formed in a passivation region 414. Each bond pad 404 may be formed from copper (Cu), aluminum (Al), nickel (Ni), gold (Au), or any other suitable bond pad material. Passivation region 414 may comprise, for example, a region including oxide and oxynitride. A thin native oxide layer 410 may form on the bottom of each bond pad 404.

Figure 6:
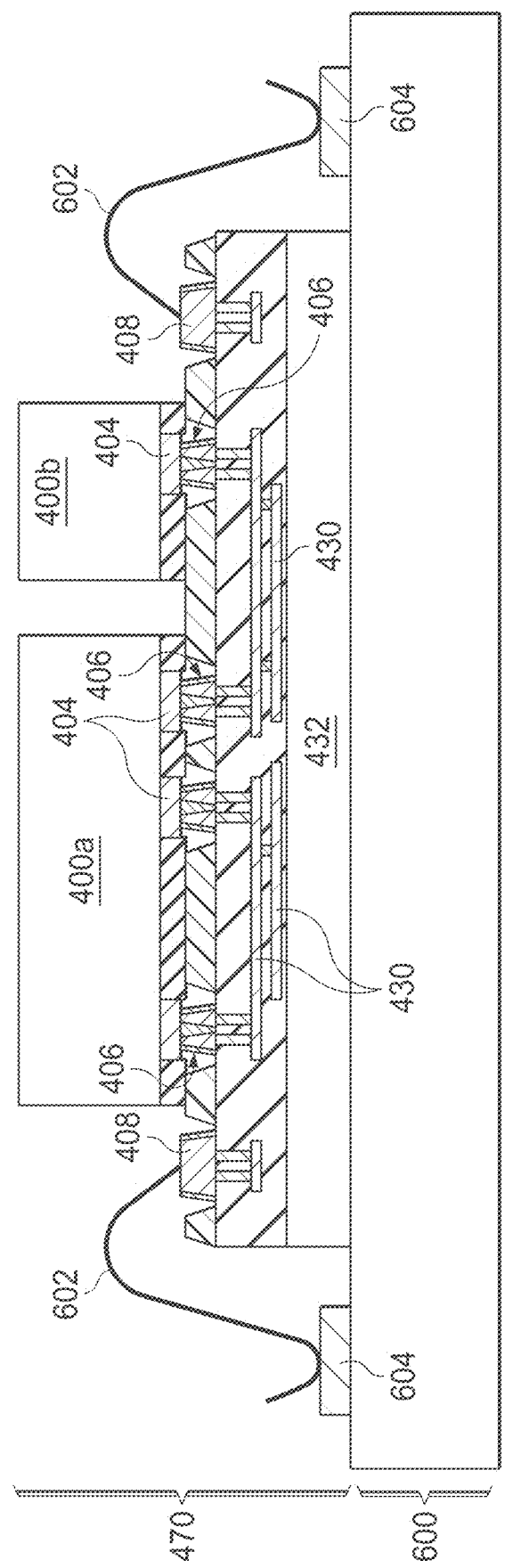
FIG. 6 is a cross-sectional side view showing a populated interposer mounted and wire-bonded to a package substrate, according to another example embodiment.

Interposer 402 may comprise an interposer or other structure for mounting dies 400a, 400b, and may be supported on a chuck 460. Interposer 402 may include circuitry including metal layers 430 formed over a silicon substrate 432. Metal layers 430 may comprise aluminum or copper interconnect layers, for example, formed in a dielectric region 434 formed over interposer silicon substrate 432. Dielectric region 434 may include any number of oxide layers or other dielectric layers. In some embodiments, interposer 402 may be a through-silicon via (TSV) interposer, which may include a number of TSV contacts 438 extending through the interposer silicon substrate 432 to provide conductive connection between metal layer(s) 430 to selected circuitry of a package substrate or other structure, e.g., as shown in FIG. 5 discussed below. In other embodiments, interposer 402 may be configured for wire-bond attachment to a package substrate or other structure using bond pads 408 (e.g., as shown in FIG. 6, discussed below), and may thus omit TSV contacts 438.

A plurality of multi-material toothed bond pads 406 and (optional) test or wire-bond pads 408 may be formed on a top side of the interposer 402, and connected to a top metal layer 430 by conductive vias 436, e.g., tungsten or copper vias. Each multi-material toothed bond pads 406 may correspond with bond pad 306 shown in FIGS. 3A-3B and discussed above. Thus, each multi-material toothed bond pad 406 may include (a) an array of vertically-extending teeth 420 formed from a first material (e.g., aluminum) and a fill material 422 comprising a second material (e.g., silver) arranged between the various teeth 420, such that the two different materials of the teeth 420 and fill material 422 are arranged in an interlaced or interleaved manner.

A native oxide layer 412 may form on exposed upper surfaces of each tooth 420 (e.g., an $Al_2O_3$ layer 412 in the case of aluminum teeth 420) to define oxidized teeth 424, e.g., as discussed above regarding FIG. 3A. In some embodiments, an underfill layer 440, e.g., comprising epoxy, may be formed between bond pads 406 and/or 408, which may provide physical support for dies 400a, 400b (once mounted) and/or provide a moisture seal for the circuitry of interposer 402 and dies 400a, 400b.

Test or wire-bond pads 408 may be formed together with multi-material toothed bond pads 406, but may be formed as a solid metal pad (e.g., aluminum).

Referring to FIG. 4B, dies 400a, 400b may be bonded to interposer 402 by direct and/or eutectic bonding, similar to the bonding of die 300 to mounting structure 302 discussed above. The resulting populated interposer is indicated at 470. For example, dies 400a, 400b may be pressed down toward interposer 402 while heat and ultrasonic vibrations (including lateral vibrations) are applied to one or more relevant structures, e.g., dies 400a, 400b, bond pads 404, interposer 402, and/or bond pads 406. For example, an ultrasonic or thermosonic head 450 may apply downward force, ultrasonic energy (causing vibrations) and/or heat to dies 400a, 400b. In addition, the interposer 402 and/or bond pads 406 may be heated by heating the chuck 460 supporting the interposer 402, or by performing the bonding process in an oven.

As discussed above regarding FIG. 3A, the upper ends or tips of the oxidized teeth 424 included in each bond pad 406 may collectively define a hard, abrasive structure 426. During an ultrasonic or thermosonic bonding process, the abrasive structure 426 defined by oxidized teeth 424 may be suitable for abrading or grinding against the native oxide layer 410 formed on bond pads 404 of dies 400a, 400b, to abrade, break, and/or remove the native oxide layers 410 and 412 on bond pads 404 and 406, respectively, which may allow direct and/or eutectic bonding between the materials of bond pads 404 and 406. In addition, the abrasion caused by the abrasive structure 426 may generate localized friction heating, which may further facilitate the bonding process. Depending on the particular process parameters (for example, the selected materials of bond pads 404 and 406, the downward force applied to bond pad 404 by ultrasonic or thermosonic head 450, the vibrational forces/movements caused by the ultrasonic energy, and/or the temperature of bond pads 404 and 406 during bonding (e.g., as raised by application of heat from head 450 in embodiments in which head 450 comprises a thermosonic head, or from an oven, or other heating system), the resulting bonding may involve one or both of (a) direct bonding between each bond pad 404 and the teeth 420 and fill material 422 of the opposing bond pad 406, and/or (b) eutectic bonding between each bond pad 404 and the teeth 420 and fill material 422 of the opposing bond pad 406, wherein the fill material 422 may help form a eutectic IMC between bond pads 404 and 406. As indicated above, in one embodiment teeth 420 are formed of aluminum and fill material 422 comprises silver.

In some embodiments, as discussed above, the teeth 420 may be roughened prior to or after formation of native oxide layer 412 on teeth 420, to further enhance the abrasive properties of the oxidized teeth 424. For example, teeth 420 may be roughened prior to formation of the native oxide 412 by controlling process parameters of a chlorine-based plasma etch to form teeth 420 to increase a porosity of the outer surfaces of teeth 420 (e.g., by creating small fissures or voids in the aluminum). As another example, an HCL wet etch may be performed to increase porosity of the surfaces of teeth 420. As another example, after formation of the native oxide layer 412, the oxidized teeth 424 may be further oxidized, e.g., in an ash chamber, to increase the thickness and roughness of the oxide layer 412 on teeth 420. As yet another example, a hydrogen chloride (HCL) wet etch may be performed on the oxidized teeth 424 to increase the porosity of the native oxide 412 and/or underlying tooth metal (e.g., aluminum), e.g., to increase a surface porosity of a surface porosity of the teeth 420 to a porosity (percentage of void space) in the range of 5-40%, in some embodiments in the range of 20%-40%.

The populated interposer 470 shown in FIG. 4B, including dies 400a and 400b bonded to interposer 402, may be mounted to a package substrate or other structure in any suitable manner, e.g., using through silicon via (TSV) connections or by wire-bonding.

FIG. 5 is a cross-sectional side view showing the populated interposer 470 of FIG. 4B mounted on a package substrate 500, according to one example embodiment. In this embodiment, interposer 470 is a TSV interposer including a plurality of TSV contacts 438, e.g., formed from copper. The package substrate 500 may include package substrate vias 502, e.g., formed from copper, extending through the vertical thickness of the package substrate 500. The package substrate 500 may be mounted to a printed circuit board (PCB) 504 or other electronic device, e.g., using a ball grid array (BGA) 506 or other solder mount.

FIG. 6 is a cross-sectional side view showing the populated interposer 470 of FIG. 4B mounted on a package substrate 600, according to another example embodiment. In this embodiment, interposer 470 may be mounted on package substrate 600 using an adhesive, and conductively connected to package substrate 600 by wire-bonds 602 formed between bond pads 408 on interposer 470 and bond pads 604 (e.g., solid aluminum pads) on package substrate 600.

FIGS. 7A-7E are cross-sectional side views showing a process for forming a mounting structure including multi-material toothed bond pads, and bonding dies (e.g., horizontally-mounted dies, or HMDs) to such multi-material toothed bond pads, according to one embodiment of the present invention. In this example, the mounting structure is an interposer; however, in other embodiments the mounting structure may be a package substrate or any other suitable integrated circuit device. While the use of aluminum and silver are particularly detailed, this is not meant to be limiting in any way, and other materials may be utilized without exceeding the scope.

Figure 7A:
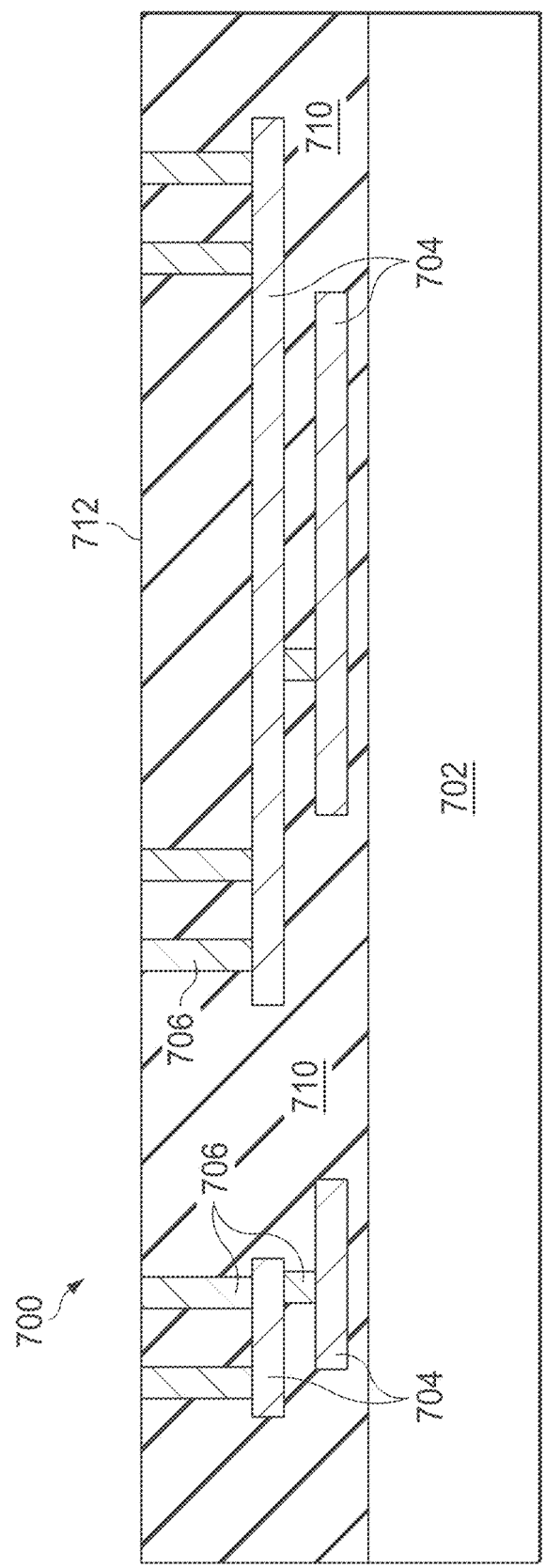
FIGS. 7A-7E are cross-sectional side views showing a process for forming a mounting structure including multi-material toothed bond pads, and bonding dies to such bond pads, according to one embodiment of the present invention.

Referring first to FIG. 7A, an interposer structure 700 is constructed by forming metal interconnect circuitry on an interposer substrate 702 (e.g., silicon substrate), which may include any number of metal layers 704 connected by vias 706, formed in a dielectric region 710 including any number of oxide layers or other dielectric layers. In one example embodiment, metal layers 704 are formed from aluminum, and vias 706 are formed from tungsten. In another embodiment, metal layers 704 may be formed by copper damascene processing.

Figure 7B:
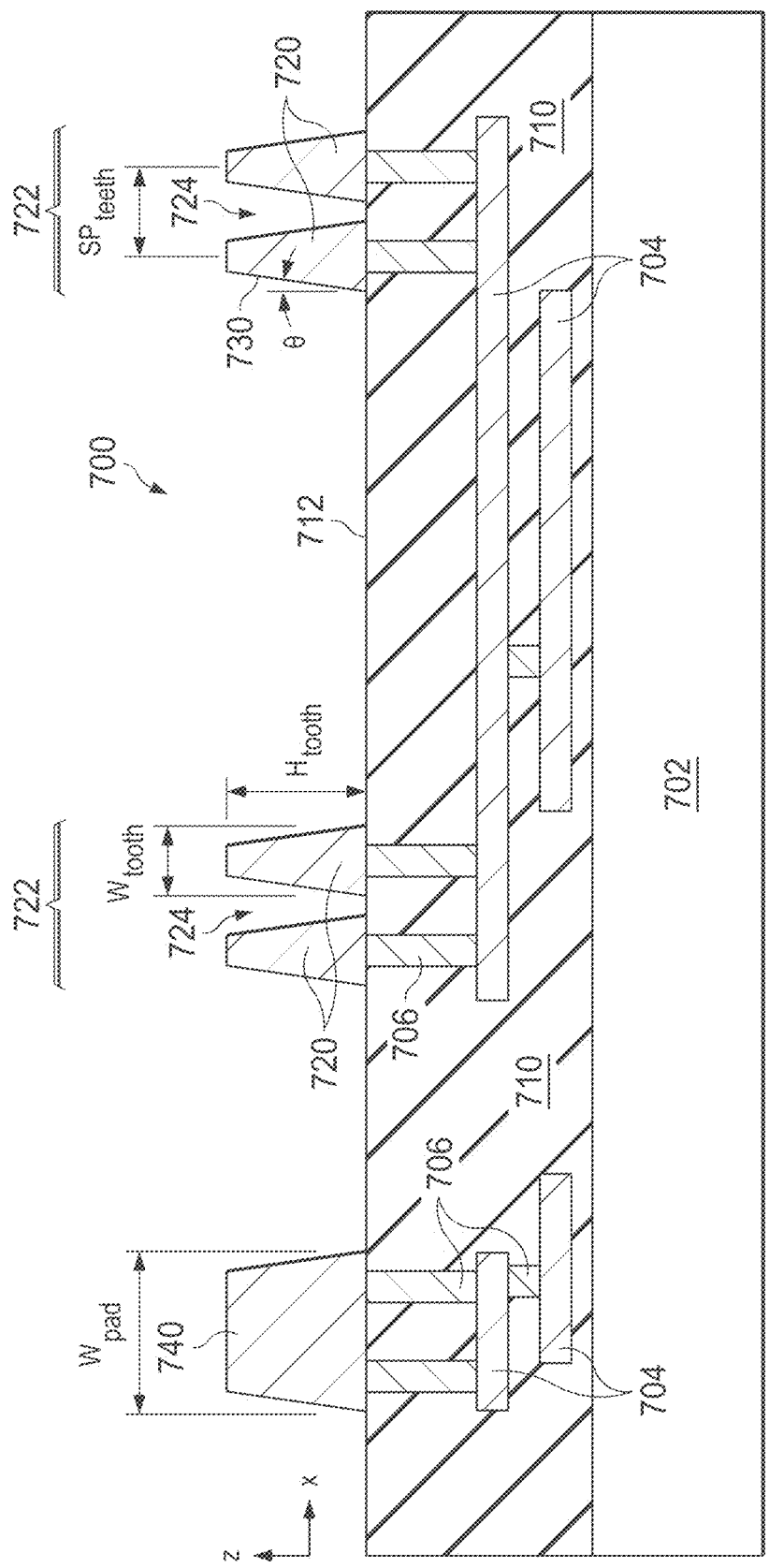

Next, referring to FIG. 7B, a relatively thick aluminum layer (e.g., greater than 1 μm, greater than 2 μm, or greater than 3 μm thick) may be deposited on the top surface 712 of interposer structure 700, and etched, e.g., using a chlorine-based plasma etch (dry etch), to define a plurality of aluminum structures including aluminum teeth 720 and, in some embodiments, at least one solid aluminum pad 740. Each solid aluminum pad 740 may be a test pad or a wire-bond pad. Aluminum teeth 720 may be formed in localized groupings 722, with each teeth grouping 722 including an array of individual teeth 720 separated from each other by open space or voids 724. Each teeth grouping 722 defines a first component of a respective multi-material toothed bond pad being constructed. The illustrated example shows two teeth groupings 722 for two multi-material toothed bond pads being formed.

Each teeth grouping 722 may include any number of teeth 720 arranged in a one- or two-dimensional array of teeth 720. Each teeth grouping 722 may include between 2 and 10,000 teeth 720. Each tooth 720 may have any suitable shape and dimensions. For example, each tooth 720 may have a tapered shape, e.g., a generally conical or pyramid shape, with a sidewall taper defined by a taper angle θ relative to normal to top surface 712. In some embodiments, each tooth 720 may have one, some or all of the following dimensional characteristics:

(a) a vertical height $H_{tooth}$ (in the z-direction) in the range of 1 μm to 5 μm;
(b) a lateral width $W_{tooth}$ (in the x-direction and/or the y-direction into the page) in the range of 0.13 μm to 2 μm, defined at a base of the tooth 720;
(c) a height-to-width ratio $H_{tooth}/W_{tooth}$ of at least 2, or at least 3, or at least 4, or at least 5, or at least 10, or in the range of 2 to 10, for example in the range of 3 to 5;
(d) a lateral spacing $SP_{teeth}$ (in the x-direction and/or the y-direction into the page) between a central axis of adjacent teeth in the range of 0.3 μm to 10 μm, e.g., in the range of 1 μm to 6 μm; and/or
(e) a sidewall taper angle θ in the range of 0° to 45°, e.g., in the range of 5° to 30°.

Adjacent teeth 720 may be completely spaced apart from each other laterally by open space or voids 724 (e.g., as shown in the example embodiment of FIG. 7B), or may be physically conjoined for a partial height of the respective teeth 720 (e.g., such that each tooth 720 has a lower base portion conjoined with at least one adjacent tooth 720 and but an upper portion spaced apart (laterally) from each adjacent tooth 720.

Each solid aluminum pad 740 (e.g., test pad or wire-bond pad) may be substantially wider than any one of the teeth 720. For example, each solid aluminum pad 740 may have a width $W_{pad}$ (in the x-direction and/or the y-direction into the page) in the range of 10 μm to 100 μm, e.g., in the range of 30 μm to 60 μm, and may have the same or different dimensions as each other solid aluminum pad(s) 740.

Figure 7C:
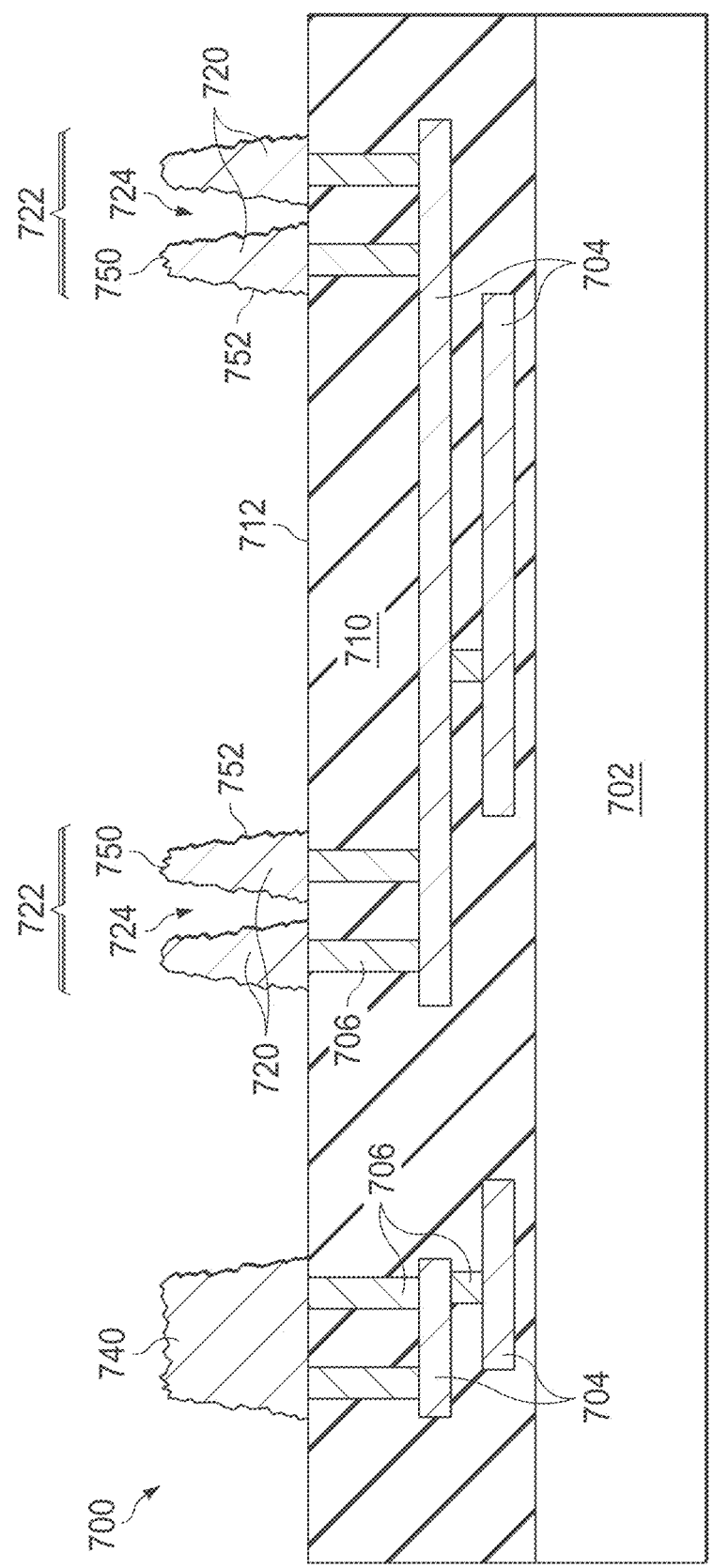

Next, referring to FIG. 7C, the exposed surfaces of teeth 720, including top surfaces 750 and sidewall surfaces 752, may be roughened, e.g., as discussed above with respect to FIGS. 3B and 4B. For example, where a chlorine-based plasma etch (dry etch) is used to form the teeth 720 from an aluminum layer, various process parameters of the chlorine-based plasma etch may be selected or controlled to increase a porosity of the surfaces 750, 752 of teeth 720 (e.g., by creating small fissures or voids in the aluminum) to a porosity (percentage of void space) in the range of 5-40%, in some embodiments in the range of 20%-40%. As another example, an HCL wet etch may be performed to increase porosity of the aluminum surfaces of teeth 720. As still another example, teeth 720 may be formed from silicon-doped aluminum, and a post-etch process may be performed to form $SiO_2$ nano-nodules at the surfaces, thereby increasing the surface roughness.

In some embodiments, the roughening techniques may increase an arithmetic mean roughness Ra of surfaces 750, 752, for example to a roughness value Ra above 5 nm, above 10 nm, above 15 nm, or above 20 nm.

Figure 7D:
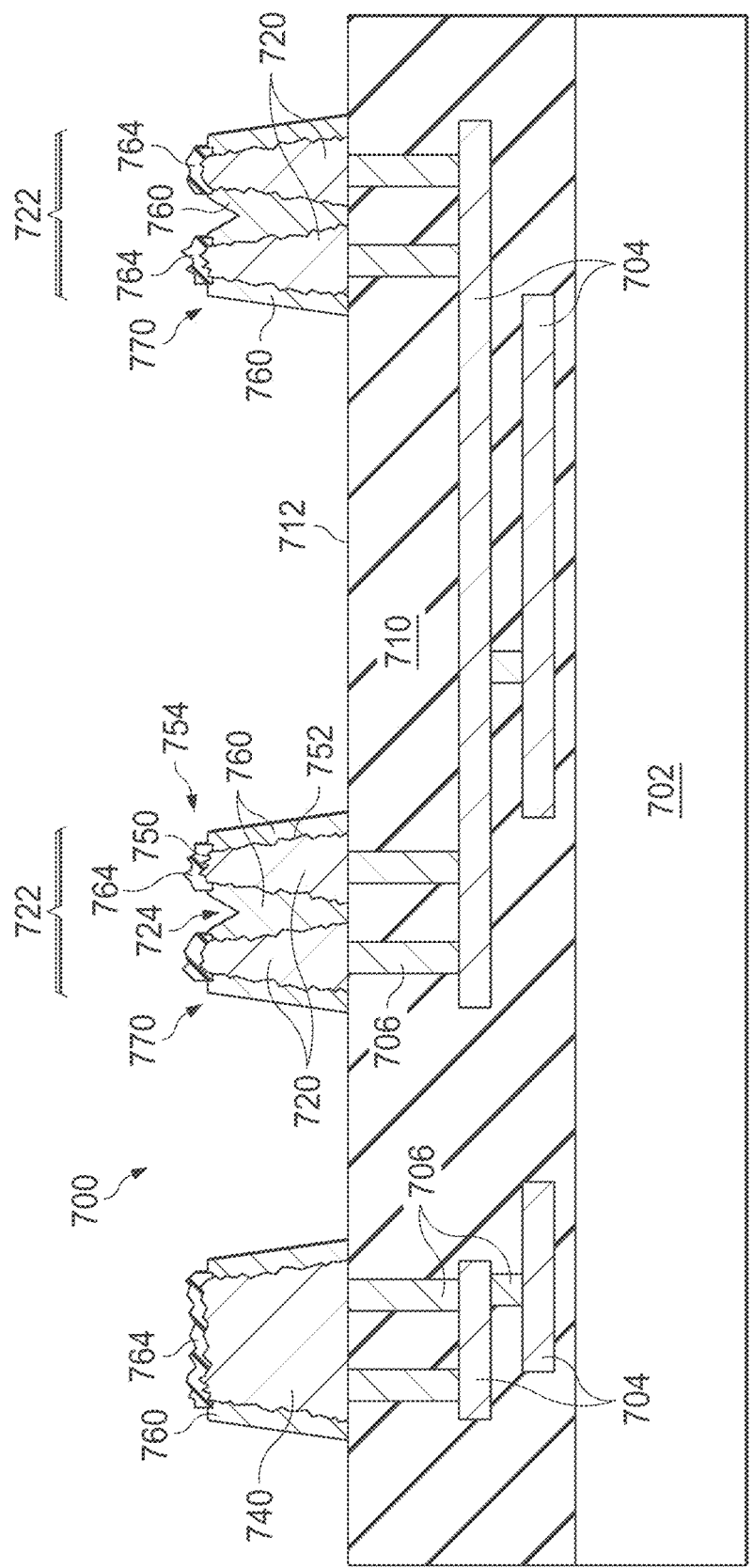

Next, as shown in FIG. 7D, the open spaces or voids 724 between teeth 720 in each teeth grouping 722 may be filled (partially or fully) with a second, different, material, such as silver, indicated at 760, to define a multi-material toothed bond pad 770 from each teeth grouping 722. For example, a layer of silver, e.g., with a thickness of 200 Å-2000 Å, may be deposited over the structure (extending over teeth 720 and the top surface 712 of interposer structure 700) and etched back, e.g., using an anisotropic etch, to partially or fully fill the open spaces or voids 724 between teeth 720 in each teeth grouping 722, and also cover the outer surfaces 752 of the outer teeth 720 in each teeth grouping 722, as shown in FIG. 7D. The etch may remove the silver layer on the top surfaces 750 of teeth 720, to thereby expose the top teeth surfaces 750.

As discussed above, a native oxide layer ($Al_2O_3$) 764 may grow on the exposed top surfaces 750 of teeth 720, to define oxidized teeth 754. In some embodiments, the oxidized teeth 754 may be roughened to further enhance the abrasive nature of the oxidized teeth 754. For example, the oxidized teeth 754 may be further oxidized, e.g., in an ash chamber, to increase the thickness and roughness of the native oxide layer 764 on teeth 720. As another example, a hydrogen chloride (HCL) wet etch may be performed on the oxidized teeth 754 to increase the porosity of the native oxide 764 and/or underlying tooth metal (e.g., aluminum), which may increase the surface roughness of the oxidized teeth 754.

The oxidized and/or further roughened teeth 754 included in each multi-material toothed bond pad 770 may collectively define a hard, abrasive structure configured to abrade against the oxide layer of an opposing bond pad to abrade, break, and/or remove such oxide layer and the oxide layers 764 on oxidized teeth 754, allowing direct and/or eutectic contact between bond pad 770 and the opposing bond pad, as discussed above.

Figure 7E:
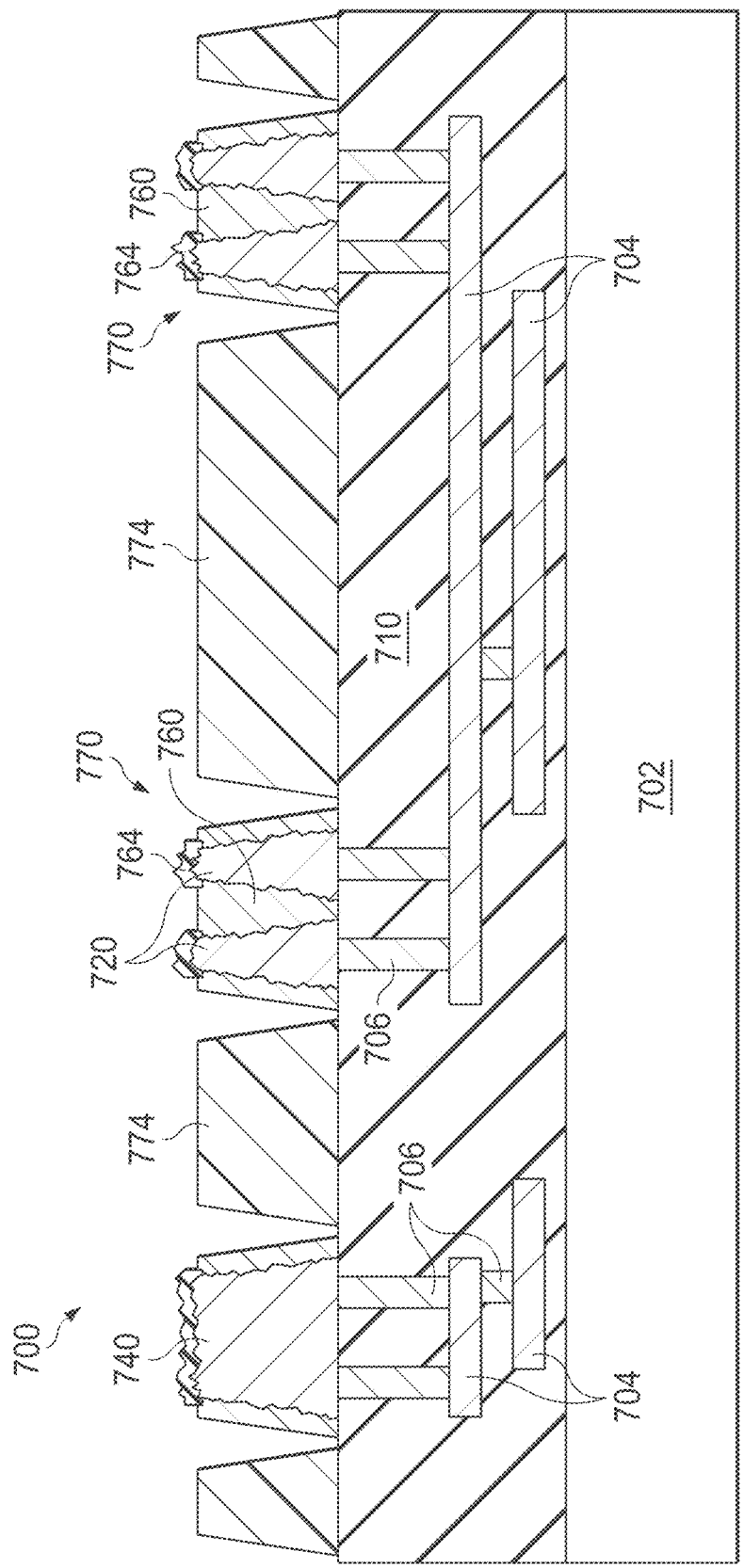

Finally, as shown in FIG. 7E, an underfill 774, e.g., comprising an epoxy, may be deposited using a stencil or needle. The height of underfill 774 may be adjusted as needed based on the shape and/or dimensions of die(s) to be mounted to the interposer 700.

As noted above, in some embodiments teeth 720 may be formed from silicon-doped aluminum (e.g., silicon doping in the range of 0.1 to 5%), and a post-etch process may be performed to form $SiO_2$ nano-nodules at the aluminum surfaces, to thereby increase the surface roughness. A rapid thermal anneal (RTA) may be performed to force the Si dopants within the aluminum to agglomerate and form sub-micron nodules. An $O_2$ re-ash oxidation process may then be performed to form $SiO_2$ nano-nodules at the surfaces of the aluminum teeth 720, to thereby increase the surface roughness.

Figure 8:
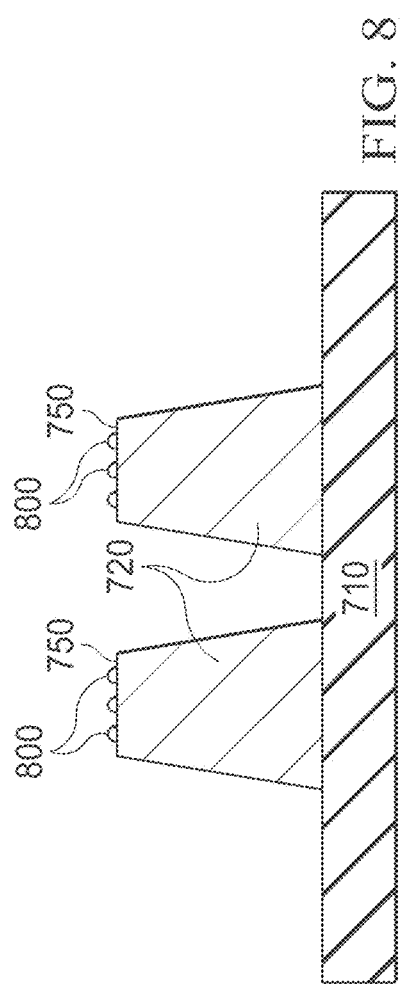
FIG. 8 illustrates an example of $SiO_2$ nano-nodules formed on the top surfaces of a pair of aluminum teeth, for enhanced abrasion during bonding, according to one embodiment of the present invention.

FIG. 8 illustrates an example of $SiO_2$ nano-nodules 800 formed on the top surfaces 750 of a pair of aluminum teeth 720.

Figure 9A:
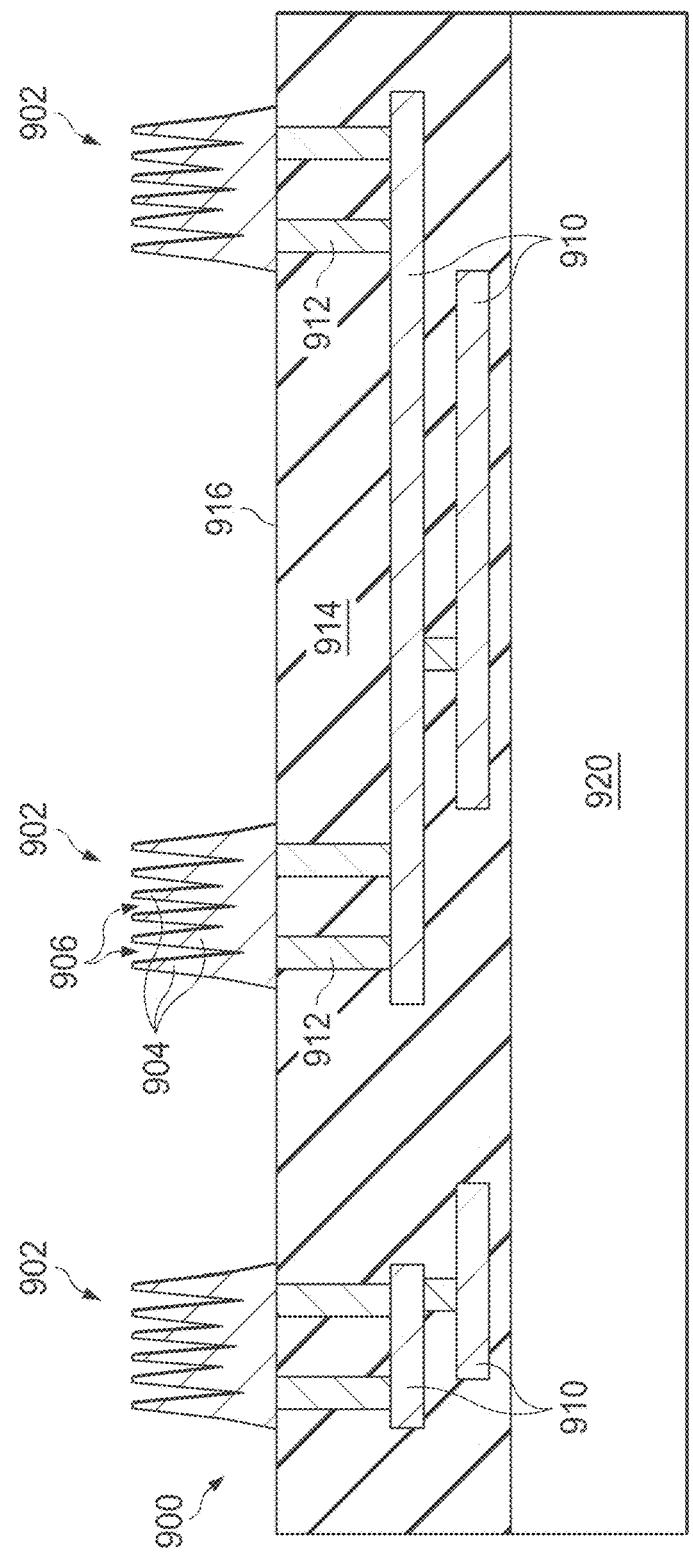
FIGS. 9A and 9B show cross-sectional views of an example process for forming multi-material toothed bond pads including an array of extremely small teeth defining a "grass-like" region, to form an extremely rough bond pad surface, according to one embodiment of the present invention.
Figure 9B:
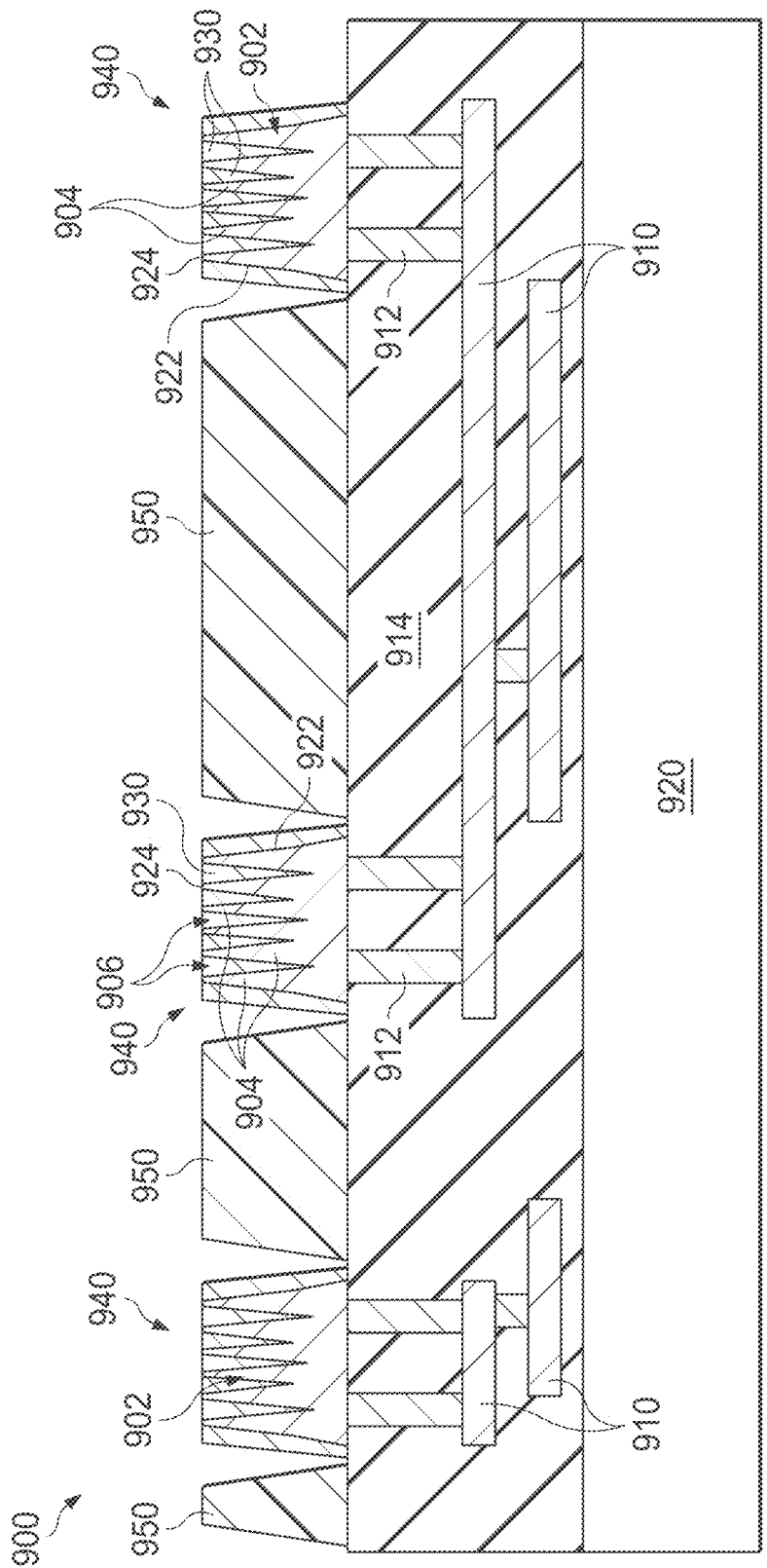

FIGS. 9A and 9B show cross-sectional views of an example process for forming multi-material toothed bond pads including an array of extremely small teeth defining a "grass-like" region, to form a very rough bond pad structure, according to one embodiment of the present invention.

As shown in FIG. 9A, three grass-like regions 902 are formed on a top surface 916 of a mounting structure, e.g., interposer 900, which may be similar to interposer 700 discussed above, e.g., including metal layers 910 and vias 912 formed in a dielectric region 914 over an interposer substrate 920. Each grass-like region 902 may include an array of narrow teeth, spikes, spires, or "blades" 904 (referred to as teeth 904, for simplicity) separated by open spaces or voids 906, to form a grass-like structure. Grass-like regions 902 may be formed from silicon or aluminum or other suitable metal, and may be formed in any suitable manner. In some embodiments, each grass-like region 902 may comprise an array of silicon spires. For example, regions of silicon "grass" including an array of teeth 904 can be grown for each region 902. As another example, as known in the art, regions of black-silicon teeth 904 may be formed by depositing a layer of black silicon and performing reactive ion etching (ME), e.g., as described in "*A Survey on the Reactive Ion Etching of Silicon in Microtechnology*" by H. V. Jansen, Han Gardeniers, M. J. Boer, M. Elwenspoek, and Jan Fluitman, Journal of Micromechanics and Microengineering, March 1996.

In some embodiments, chemical processing may be performed to produce black silicon with nanopores, which may further increase the roughness of each grass-like region 902. It is known in the art that silicon can be conductive, especially when coated with silver or other suitable material, e.g., as fill material in the open spaces or voids 906 between the silicon teeth 904 in each grass-like region 902.

As shown in FIG. 9B, the open spaces or voids 906 between the teeth 904 in each grass-like region 902 may be filled (partially or fully) with silver or other suitable fill metal, indicated at 930. For example, a layer of silver, e.g., with a thickness of 200 Å-2000 Å, may be deposited over the structure (extending over teeth 904 and the top surface 916 of interposer 900) and etched back, e.g., using an anisotropic etch, to partially or fully fill the open spaces or voids 906 between vertically-extending teeth 904 in each grass-like region 902, and also cover the outer surfaces 922 of the outer teeth 904 in each grass-like region 902. The etch may remove the silver layer on the top surfaces 924 of vertically-extending teeth 904, to thereby expose the top surfaces 924 of teeth 904.

Each grass-like region 902 including teeth 904 and fill material 930 defines a grass-like bond pad 940. The top of each grass-like bond pad 940 may have a roughness Ra great than 15 nm, e.g., in the range of 15-100 nm.

In addition, in some embodiments an underfill 950, e.g., comprising an epoxy, may be deposited using a stencil or needle. The height of underfill 950 may be adjusted as needed based on the shape and/or dimensions of die(s) to be mounted to the interposer 900.

Figure 10B:
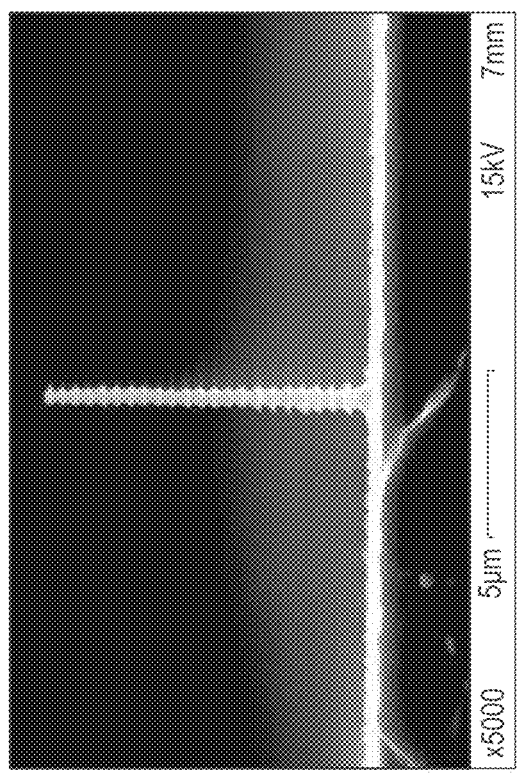
FIG. 10B shows an example electron microscope image of an individual single black silicon spire.
Figure 10A:
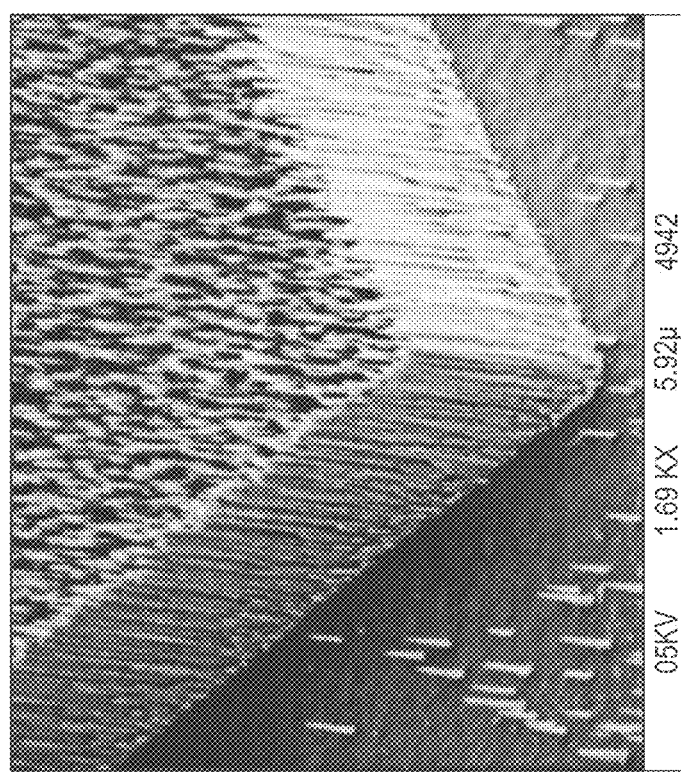
FIG. 10A shows an example electron microscope image of an example grass-like region formed from black silicon.

FIG. 10A shows an example electron microscope image of an example grass-like region 902 formed from black silicon, from the paper "*A Survey on the Reactive Ion Etching of Silicon in Microtechnology*" referenced above. FIG. 10B shows an example electron microscope image of an individual single black silicon spire.

The multi-material toothed bond pads disclosed herein may be formed on any suitable integrated circuitry device. For example, in the example embodiments shown in FIGS. 3A through 9B and discussed above, the multi-material toothed bond pads are formed on the mounting structure (e.g. interposer or package substrate) to which one or more dies are mounted. In other embodiments, any of the multi-material toothed bond pads disclosed herein may instead be formed on each die, or may be formed both on the dies and the mounting structure, e.g., using any of the materials and techniques disclosed herein.

In addition, in some embodiments, a bond pad configured to bond with a toothed bond pad according to the present disclosure may have a three-dimensional shape designed to further improve bonding with the toothed bond pad, e.g., a three-dimensional shape including recesses or other geometries configured to receive the teeth of the toothed bond pad.

Figure 11A:
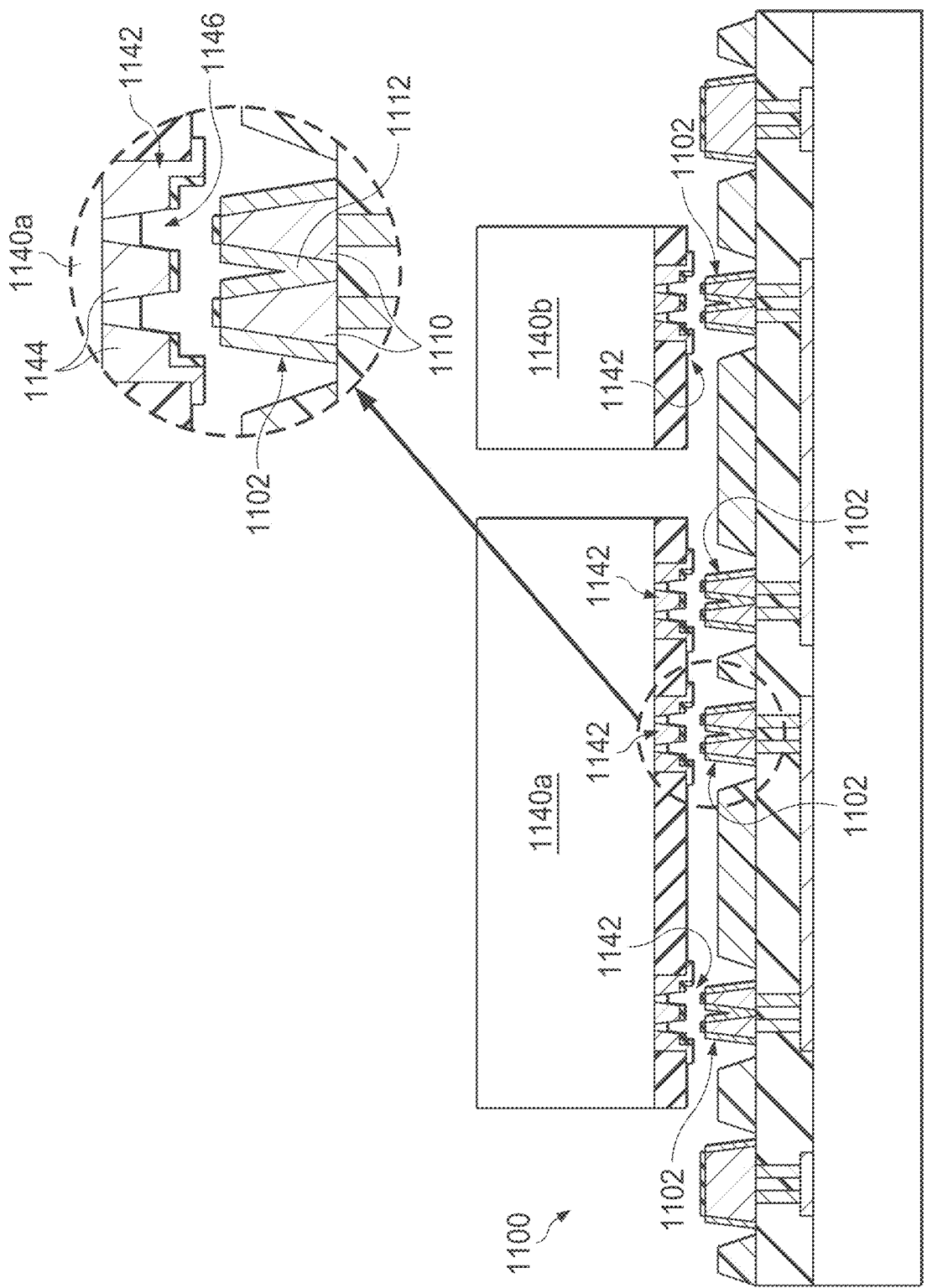
FIGS. 11A and 11B show an example embodiment in which each die includes bond pads shaped to receive corresponding multi-material toothed bond pads on a mounting structure, e.g., interposer or package substrate.
Figure 11B:
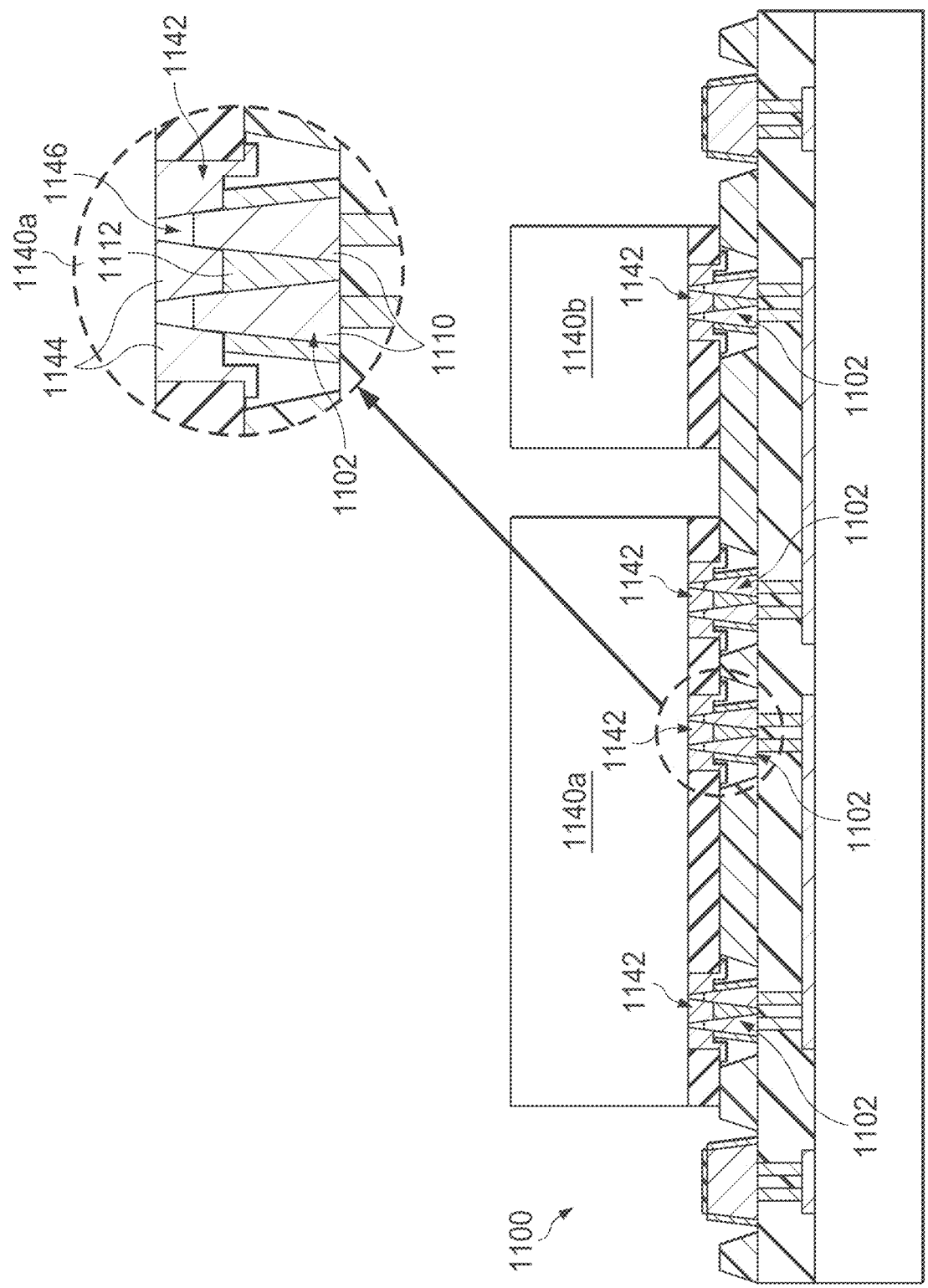

For example, FIGS. 11A and 11B show an example embodiment in which each die includes bond pads shaped to receive corresponding multi-material toothed bond pads on a mounting structure, e.g., interposer or package substrate. FIG. 11A shows a mounting structure 1100 including multi-material toothed bond pads 1102, each including an array of teeth 1110 and fill material 1112 in the spaces between adjacent teeth 1110. FIG. 11A shows dies 1140a and 1140b including bond pads 1142 shaped to receive the teeth 1110 of corresponding bond pads 1102 provided on mounting structure 1100. In particular, each bond pad 1142 may include a plurality of protrusions 1144 that define openings or voids 1146 configured to receive teeth 1110. Bond pads 1142 may be formed from aluminum or other suitable metal. In some embodiments, protrusions 1144 may be tapered, rounded, or otherwise configured to facilitate a self-alignment of each bond pad 1142 with a corresponding bond pad 1102.

FIG. 11B shows dies 1140a and 1140b mounted to mounting structure 1100, wherein the teeth 1110 of each bond pad 1102 are received in the openings or voids 1146 defined between protrusions 1144 of a corresponding bond pad 1142. Similarly, protrusions 1144 of bond pad 1142 are received in the filled spaces 1112 between the teeth 1110 of bond pad 1102.

Figure 12A:
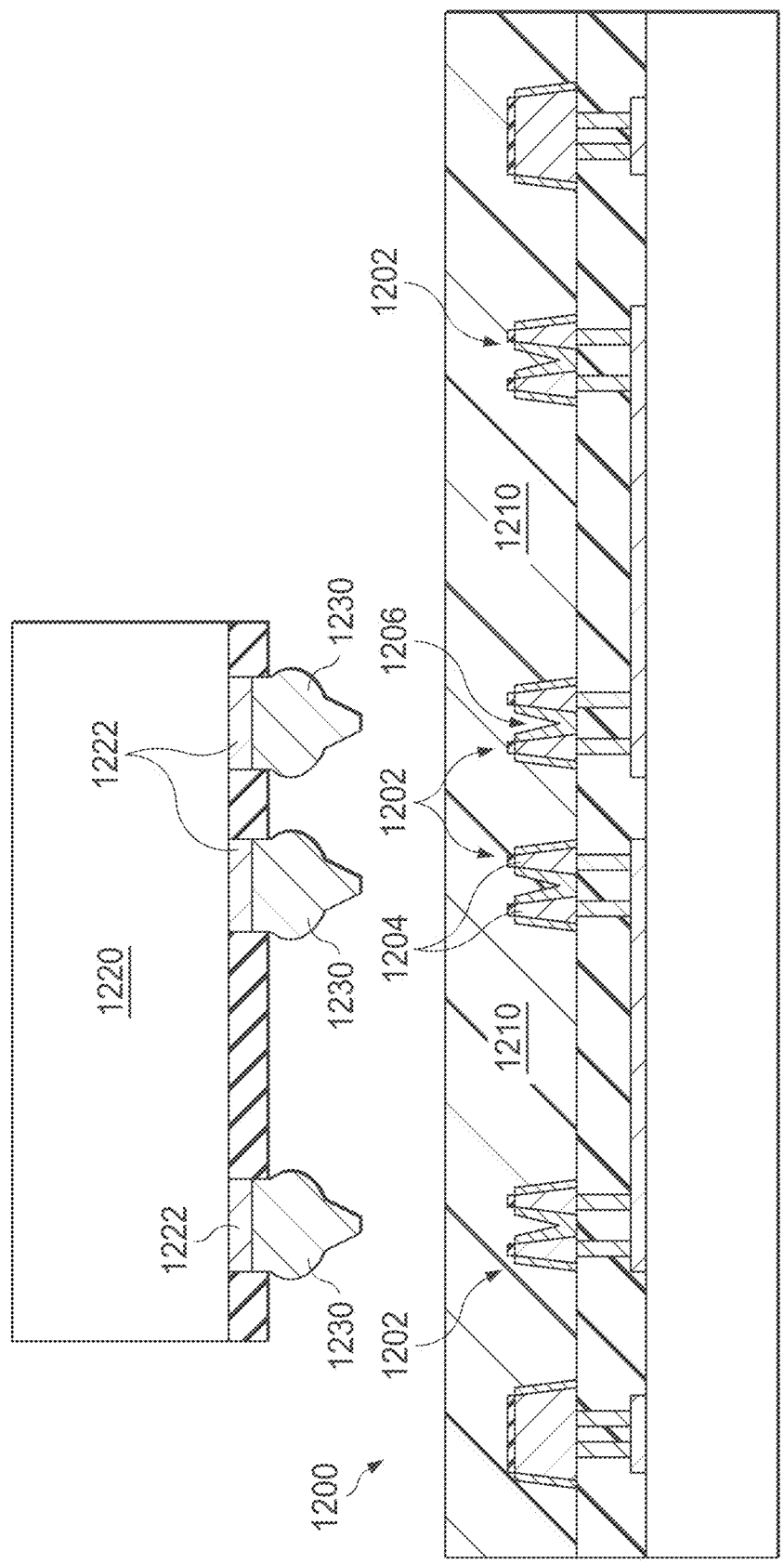
FIGS. 12A and 12B show an example embodiment in which gold stud bumps are applied to the bond pads of a die being mounted to a mounting structure having multi-material toothed bond pads.
Figure 12B:
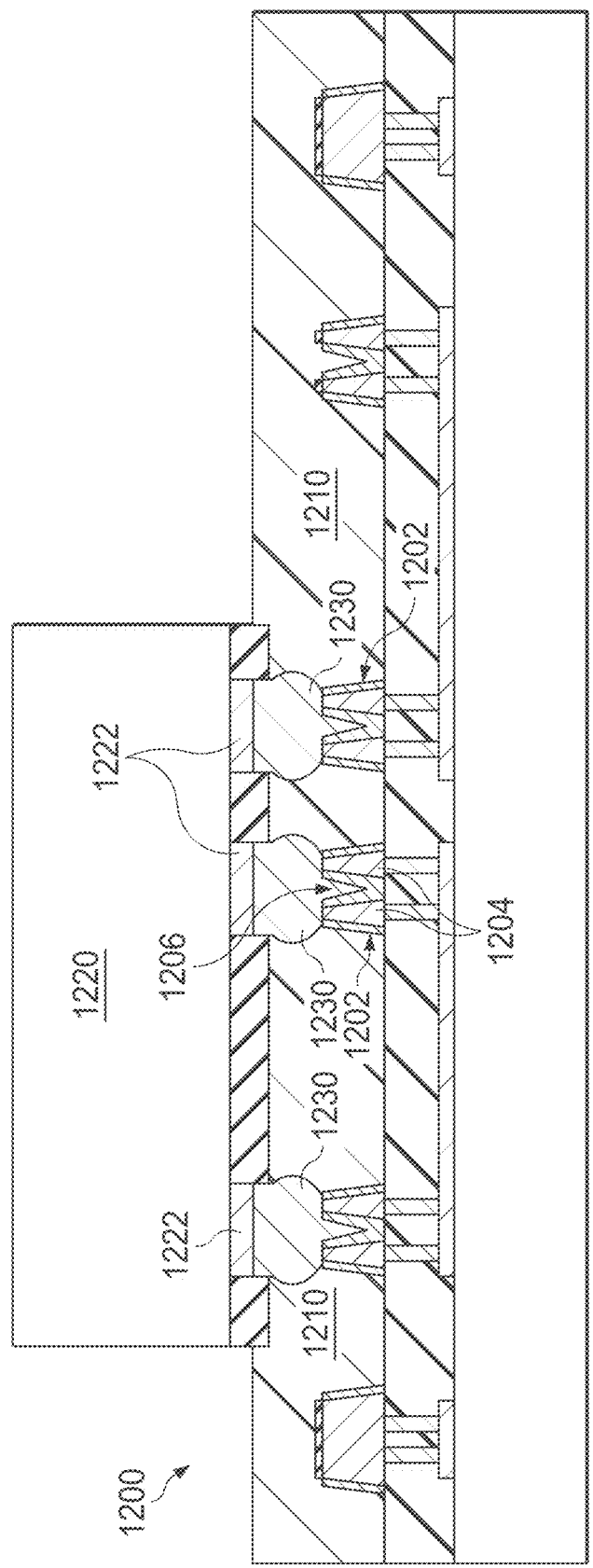

In some embodiments, metal bumps, e.g., gold stud bumps, may be applied to the bond pads that engage with multi-material toothed bond pads according to the present disclosure, to further improve the bonding between the respective bond pads. For example, FIGS. 12A and 12B show an example embodiment in which gold stud bumps are applied to the bond pads of a die being mounted to a mounting structure having multi-material toothed bond pads. FIG. 12A shows an example mounting structure 1200 (e.g., interposer or package substrate) including multi-material toothed bond pads 1202 fully covered by an underfill region 1210, e.g., comprising epoxy. Each multi-material toothed bond pad 1202 may include an array of aluminum teeth 1204, each comprised of aluminum, and fill material 1206, comprised of silver, in the spaces between adjacent teeth 1204, e.g., as discussed above. A die 1220 with one or more solid aluminum bond pads 1222 may include a gold stud bump 1230 formed on or attached to each bond pad 1222.

FIG. 12B shows die 1220 mounted to mounting structure 1200, wherein the gold stud bumps punch through the underfill region 1210 (e.g., epoxy) and into the silver-filled spaces 1206 between the teeth 1204 of each bond pad 1202. A thermosonic bonding process may be performed, which may form eutectic bonds between each gold bump 1230 and the aluminum and silver of each bond pad 1202. Underfill region 1210 may provide a moisture seal for the mounted structure.

The invention claimed is:

1. A method of forming a multi-material toothed bond pad, the method comprising:
    forming a layer of a first material;
    etching the layer of the first material to define (a) a plurality of vertically-extending teeth formed from the first material and (b) open spaces between the plurality of vertically-extending teeth;

depositing a layer of the second material over the plurality of vertically-extending teeth and extending down into the open spaces between the plurality of vertically-extending teeth; and removing portions of the second material over the plurality of vertically-extending teeth to expose upper surfaces of the plurality of vertically-extending teeth.

2. The method of claim 1, wherein removing a portion of the second material over the plurality of vertically-extending teeth to expose upper surfaces of the plurality of vertically-extending teeth comprises etching portions of the second material over the plurality of vertically-extending teeth to expose upper surfaces of the plurality of vertically-extending teeth.

3. The method of claim 1, wherein the first material comprises aluminum, and the second material comprises silver.

4. The method of claim 1, further comprising performing a roughening process to increase a surface roughness of the plurality of vertically-extending teeth.

5. A bonding method, comprising:
providing a first integrated circuit (IC) device including a first IC device bond pad comprising:
a plurality of oxidized teeth, each oxidized tooth comprising a vertically-extending tooth formed from a first material and a first oxide layer formed on the vertically-extending tooth; and
a second material arranged in spaces between the plurality of oxidized teeth, the second material being different than the first material;
wherein the plurality of oxidized teeth define an abrasive structure; and
performing a bonding process to bond the first IC device of the first IC device to a second IC device bond pad of a second IC device, the second IC device bond pad having a second oxide layer formed thereon;
wherein during the bonding process, the abrasive structure defined by the plurality of oxidized teeth of the bond pad of the first IC device interacts with the second oxide layer formed on the second IC device bond pad to abrade, break, or remove the first oxide layer formed on the vertically-extending teeth and the second oxide layer formed on the second IC device bond pad.

6. The bonding method of claim 5, wherein the bonding process includes applying ultrasonic energy to at least one of the first IC device bond pad and the second IC device bond pad.

7. The bonding method of claim 5, wherein the bonding process includes using a thermosonic device to apply ultrasonic energy and heat to at least one of the first IC device bond pad and the second IC device bond pad.

8. The bonding method of claim 5, wherein the bonding process causes a eutectic bonding between the first IC device bond pad and second IC device bond pad.

9. The bonding method of claim 5, wherein the bonding process causes a eutectic bonding between (a) the first material forming the vertically-extending teeth of the first IC device bond pad, (b) the second material arranged in spaces between the plurality of vertically-extending teeth, and (c) the second IC device bond pad.

10. The bonding method of claim 9, wherein:
the first material comprises aluminum;
the second material comprises silver; and
the second IC device bond pad comprises aluminum.

11. The method of claim 1, comprising forming silicon nodules on the vertically-extending teeth.

12. The method of claim 1, comprising forming an oxide layer on respective ones of the plurality of vertically-extending teeth.

13. The method of claim 1, comprising forming an oxide layer on exposed upper surfaces of the plurality of vertically-extending teeth, so that respective vertically-extending teeth include (a) respective side surfaces covered by the second material and (b) respective upper surfaces uncovered by the second material and covered by the oxide layer.

14. The method of claim 1, wherein the first material comprises aluminum, and the second material comprises silver.

15. A method of forming a multi-material toothed bond pad, the method comprising:
forming a plurality of vertically-extending teeth formed from a first material;
depositing a second material between the plurality of vertically-extending teeth, wherein the second material is softer than the first material;
removing portions of the deposited second material to expose upper surfaces of the vertically-extending teeth; and
forming an oxide layer on the exposed upper surfaces of respective ones of the plurality of vertically-extending teeth.

16. The method of claim 15, comprising performing a roughening process to increase a surface roughness of the plurality of vertically-extending teeth.

17. The method of Claim 15, wherein respective vertically-extending teeth include (a) respective side surfaces covered by the second material and (b) respective upper surfaces uncovered by the second material and covered by the oxide layer.

18. The method of claim 15, comprising forming silicon nodules on the vertically-extending teeth.

19. The method of claim 15, wherein the first material comprises aluminum, and the second material comprises silver.

20. A method of forming a multi-material toothed bond pad, the method comprising:
forming a plurality of vertically-extending teeth formed from a first material;
depositing a second material between the plurality of vertically-extending teeth, wherein the second material is softer than the first material; and
forming an oxide layer on respective ones of the plurality of vertically-extending teeth;
wherein respective vertically-extending teeth include (a) respective side surfaces covered by the second material and (b) respective upper surfaces uncovered by the second material and covered by the oxide layer.

* * * * *